(12) United States Patent
Ceglio et al.

(10) Patent No.: US 8,873,025 B2
(45) Date of Patent: *Oct. 28, 2014

(54) EUV COLLECTOR SYSTEM WITH ENHANCED EUV RADIATION COLLECTION

(71) Applicant: Media Lario, S.R.L., Bosisio Parini (IT)

(72) Inventors: Natale M. Ceglio, Pleasanton, CA (US); Gopal Vasudevan, San Jose, CA (US)

(73) Assignee: Media Lario S.r.l., Bosisio Parini (LC) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 14/056,654

(22) Filed: Oct. 17, 2013

(65) Prior Publication Data

US 2014/0043595 A1 Feb. 13, 2014

Related U.S. Application Data

(62) Division of application No. 13/065,008, filed on Mar. 11, 2011, now Pat. No. 8,587,768.

(60) Provisional application No. 61/341,806, filed on Apr. 5, 2010.

(51) Int. Cl.

| | | |
|---|---|---|
| *G03F 7/20* | (2006.01) | |
| *G02B 5/08* | (2006.01) | |
| *G02B 5/10* | (2006.01) | |
| *G02B 5/20* | (2006.01) | |
| *G02B 27/09* | (2006.01) | |

(52) U.S. Cl.
CPC ........ *G03F 7/70008* (2013.01); *G03F 7/70033* (2013.01); *G03F 7/70175* (2013.01); *G02B 5/0891* (2013.01); *G02B 5/10* (2013.01); *G02B 5/208* (2013.01); *G02B 27/0927* (2013.01); *G02B 27/0983* (2013.01); *G03F 7/70166* (2013.01)

USPC ................................ 355/67; 355/77; 359/853

(58) Field of Classification Search
CPC ........ G02B 5/0891; G02B 5/10; G02B 5/208; G02B 27/0927; G02B 27/0983; G03F 7/7008; G03F 7/70033; G03F 7/70166; G03F 7/70175; G03F 7/702; G03F 7/70233
USPC .................. 355/53, 67, 71, 77; 359/359, 853; 372/76

See application file for complete search history.

(56) References Cited

U.S. PATENT DOCUMENTS

| | | | | |
|---|---|---|---|---|
| 5,497,008 A | * | 3/1996 | Kumakhov ................ | 250/505.1 |
| 6,678,348 B1 | * | 1/2004 | Kumakhov ..................... | 378/84 |
| 8,330,131 B2 | * | 12/2012 | Ceglio et al. .............. | 250/504 R |
| 2006/0078089 A1 | * | 4/2006 | Masaki et al. ................ | 378/119 |
| 2006/0131515 A1 | * | 6/2006 | Partlo et al. ............... | 250/504 R |

* cited by examiner

*Primary Examiner* — Colin Kreutzer
(74) *Attorney, Agent, or Firm* — Opticus IP Law PLLC

(57) ABSTRACT

A collector system for extreme ultraviolet (EUV) radiation includes a collector mirror and a radiation-collection enhancement device (RCED) arranged adjacent an aperture member of an illuminator. The collector mirror directs EUV radiation from an EUV radiation source towards the aperture member. The RCED redirects a portion of the EUV radiation that would not otherwise pass through the aperture of the aperture member or that would not have an optimum angular distribution, to pass through the aperture and to have an improved angular distribution better suited to input specifications of an illuminator. This provides the illuminator with greater amount of useable EUV radiation than would otherwise be available from the collector mirror alone, thereby enhancing the performing of an EUV lithography system that uses such a collector system with a RCED.

26 Claims, 23 Drawing Sheets

FIG. 3  *Prior Art*

EUV COLLECTOR SYSTEM WITH ENHANCED EUV RADIATION COLLECTION

CLAIM OF PRIORITY

This application claims the benefit of priority under 35 U.S.C. §119(e) of U.S. Provisional Application Ser. No. 61/341,806, filed on Apr. 5, 2010, which application is incorporated by reference herein, and is a Divisional Application of U.S. patent application Ser. No. 13/065,008, filed on Mar. 11, 2011, and which is incorporated by reference herein.

FIELD

The present disclosure relates generally to collectors for extreme ultraviolet (EUV) radiation, and in particular to EUV collector systems having enhanced EUV radiation collection capability.

BACKGROUND ART

EUV collector systems are used in EUV lithography systems to collect EUV radiation from an EUV radiation source and direct the EUV radiation to an aperture typically referred to as or associated with the intermediate focus. The radiation from the intermediate focus is then relayed by an illuminator to illuminate a reflective reticle. Radiation reflected from the illuminated reticle is then projected onto a wafer coated with a photosensitive material such as photoresist that records the reticle image. The wafer is then processed to form integrated microcircuits.

FIG. 1 is a schematic diagram of a generalized configuration of a collector system 10N that uses a normal-incidence collector (NIC) mirror MN. FIG. 2 is a schematic diagram of a generalized configuration of a collector system 10G that uses a grazing-incident collector (GIC) mirror MG. Each collector system 10N and 10G has an EUV radiation source RS that emits EUV radiation 12, a central axis A1, and an intermediate focus IF. Each collector system 10N and 10G is shown arranged adjacent an illuminator 20 that has an entrance aperture member 22 that defines an entrance aperture 24. Entrance aperture member 22 is arranged at or near the intermediate focus IF. NIC mirror MN has a common input and output side 17, while GIC mirror MG has an input end 16 and an output end 18.

In each collector system 10N and 10G, an important performance metric for EUV lithography is the amount and angular distribution of EUV radiation 12 the collector mirror MN or MG can deliver to the intermediate focus IF and through the entrance aperture 24 of illuminator 20. As mentioned above, also of importance is the angular distribution of the EUV radiation 12 delivered through entrance aperture 24 of illuminator 20. Entrance aperture 24 is used to define the limits of the intermediate focus IF so that illuminator 20 can have the proper field size and numerical aperture for illuminating the reticle (not shown).

However, because neither type of collector system 10N or 10G can be made to perform perfectly, and because of magnification constraints on the system design, entrance aperture member 22 of illuminator 20 may also end up intercepting a substantial amount of EUV radiation 12L, so that this intercepted EUV radiation 12L is lost and is not utilized by the illuminator 20, as illustrated in FIG. 3.

Also, due to design limitations or manufacturing imperfections in the collector system 10N or 10G, EUV radiation 12 passing through the entrance aperture 24 may not have the optimum angular distribution for use by the illuminator 20. This lost or non-optimum EUV radiation 12L is problematic because as much useable EUV radiation 12 as possible must be provided to illuminator 20 so that there is sufficient radiation to uniformly illuminate the reticle and adequately expose the photosensitive material (photoresist) on the wafer.

SUMMARY

The present disclosure is directed to EUV collector systems having enhanced EUV radiation collection capability. The enhanced EUV radiation collection capability is provided by a radiation-collection enhancement device (RCED) that is arranged at or adjacent an illuminator entrance aperture member that defines an entrance aperture. One RCED on either side of the illuminator entrance pupil (aperture) can be used, or two RCEDs on either side of the illuminator entrance pupil (aperture) can be used. The RCED can be configured so that EUV radiation that would otherwise not pass through the entrance aperture is redirected through the entrance aperture. In addition, by selectively configuring the inner surface of the RCED, a desired angular distribution (e.g., one that is more compatible with illumination system requirements) of the EUV radiation passing through the entrance aperture can be obtained.

The RCED need not be circularly symmetric and can have one or more different types of inner surfaces (e.g., polished, planar, rough, undulating, etc.) that can grazingly reflect or otherwise re-direct incident EUV radiation. Some of this redirected EUV radiation can be used to illuminate discrete detectors that may be, for example, part of an EUV lithography alignment system. A roughened inner surface, for example, may be employed in certain applications, and on some or all of the at least one inner surface, where it is advantageous to scatter the otherwise less useful EUV radiation through the entrance aperture of the illuminator, for example to homogenize the radiation distribution in the far field. The one or more inner surfaces are thus referred to herein below also as "redirecting surfaces."

Some embodiments of the RCED include multiple inner surfaces, such as defined by concentric mirror shells. The RCED can be attached to the entrance aperture of the illuminator or can be spaced apart therefrom.

The RCED can be configured (or be exchanged out for another RCED at a semiconductor manufacturing facility) to accommodate changes in the requirements on the EUV radiation being delivered to the illuminator. The RCED can be used to reduce the collection specifications on the collector mirror, making it easier to build and/or lower the cost of the collector system. The RCED is particularly useful in mitigating adverse affects due to collector system misalignments and perturbations. The RCED can be configured so that the captured light that would otherwise be lost or be less useful because of improper angular distribution can be redirected to the illuminator while still preserving (or at least substantially preserving) the etendue of the collector-illuminator system.

An example RCED uses grazing-incident reflection to direct otherwise lost or less useful radiation through the entrance aperture of the illuminator. The redirecting surface of RCED can be highly polished and have a coating that maximizes the critical angle for grazing-incident reflection and enhances the collection solid angle. The coating may comprise a single layer or multilayer. Example coating materials include Ruthenium for a single-layer coating and Mo/Si for multilayer coatings.

Thus, an aspect of the disclosure is a collector system for collecting and directing EUV radiation from an EUV radiation source through an aperture of an aperture member. The collector system includes a collector mirror configured to collect and direct the EUV radiation toward the aperture. The collector system also includes a radiation-collection enhancement device arranged at or adjacent the aperture and configured to collect a portion of the EUV radiation that would not otherwise pass through the aperture or would pass through the aperture at less than optimum angular distribution and redirect said portion of the EUV radiation through the aperture and with an angular distribution better suited for use by the illuminator.

Another aspect of the disclosure is a method of collecting EUV radiation from an EUV radiation source and directing the EUV radiation through an aperture. The method includes collecting the EUV radiation from the radiation source and directing the EUV radiation to the aperture. The method also includes collecting a portion of the directed EUV radiation that would not otherwise pass through the aperture with at least one redirecting surface arranged adjacent the aperture, and redirecting said portion of EUV radiation through the aperture.

Another aspect of the disclosure is a method of collecting EUV radiation in EUV lithography system having an aperture member with an aperture. The method includes generating the EUV radiation with an EUV radiation source. The method also includes collecting the EUV radiation from the EUV radiation source with an EUV collector and directing the EUV radiation to the aperture. A first portion of the directed EUV radiation is directed to pass through the aperture and a second portion of EUV radiation is directed to be intercepted by the aperture member. The method further includes collecting the second portion of EUV radiation with at least one first redirecting surface arranged adjacent the aperture, and redirecting the portion of EUV radiation through the aperture so that both the first and second portions of the directed EUV radiation pass through the aperture.

Additional features and advantages of the disclosure are set forth in the detailed description below, and in part will be readily apparent to those skilled in the art from that description or recognized by practicing the disclosure as described herein, including the detailed description which follows, the claims, as well as the appended drawings. The claims set forth hereinbelow constitute part of this specification and are incorporated herein directly and by reference.

Figure 1:
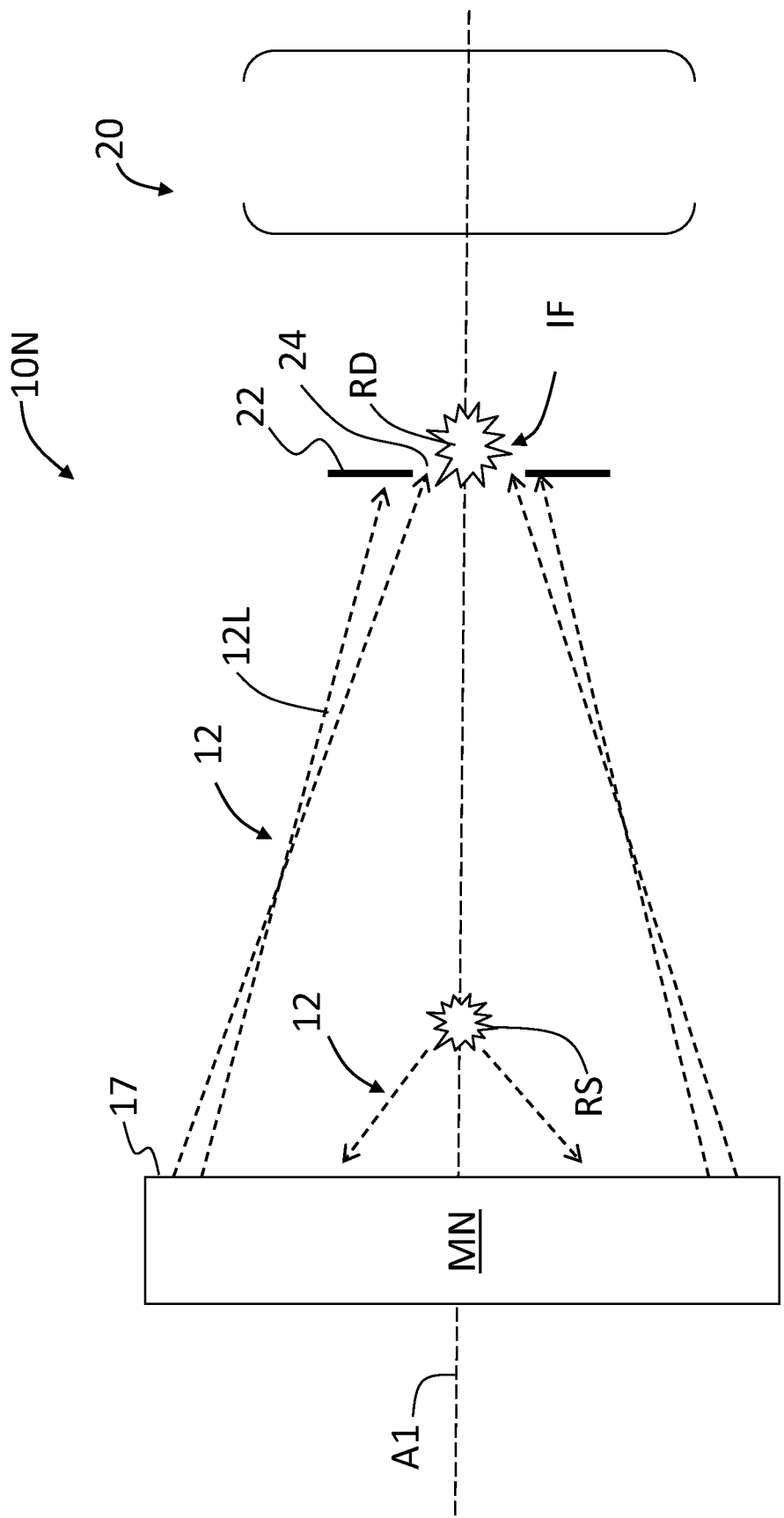
FIG. 1 is a schematic diagram of a generalized prior art NIC collector system, illustrating how some of the focused EUV radiation does not make it through the -entrance aperture.

The various elements depicted in the drawing are merely representational and are not necessarily drawn to scale. Certain sections thereof may be exaggerated, while others may be minimized. The drawing is intended to illustrate an example embodiment of the disclosure that can be understood and appropriately carried out by those of ordinary skill in the art.

In the discussion below, the term "far field" is generally understood as being a substantial distance beyond the intermediate focus IF, e.g., 1 meter or greater.

DETAILED DESCRIPTION

Figure 2:
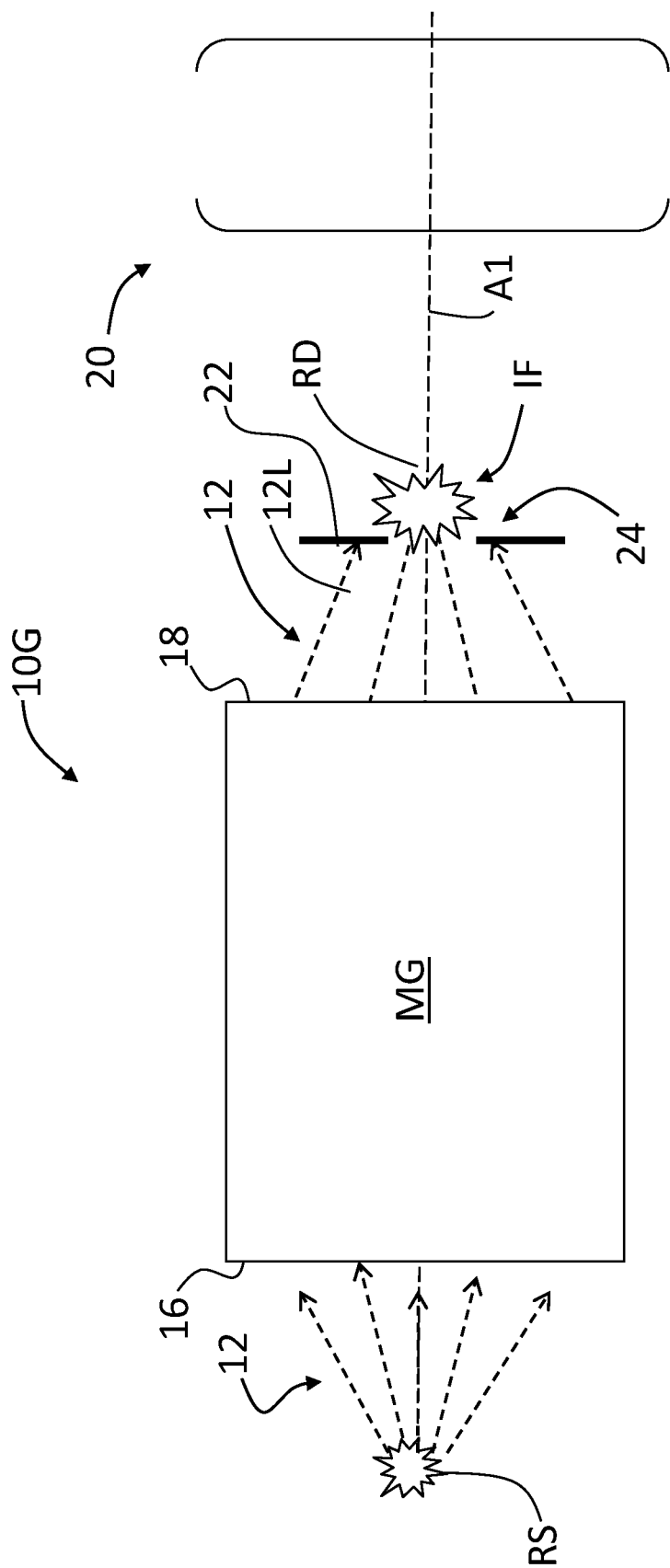
FIG. 2 is a schematic diagram of a generalized prior art GIC collector system, illustrating how some of the focused EUV radiation does not make it through the entrance aperture member.
Figure 3:
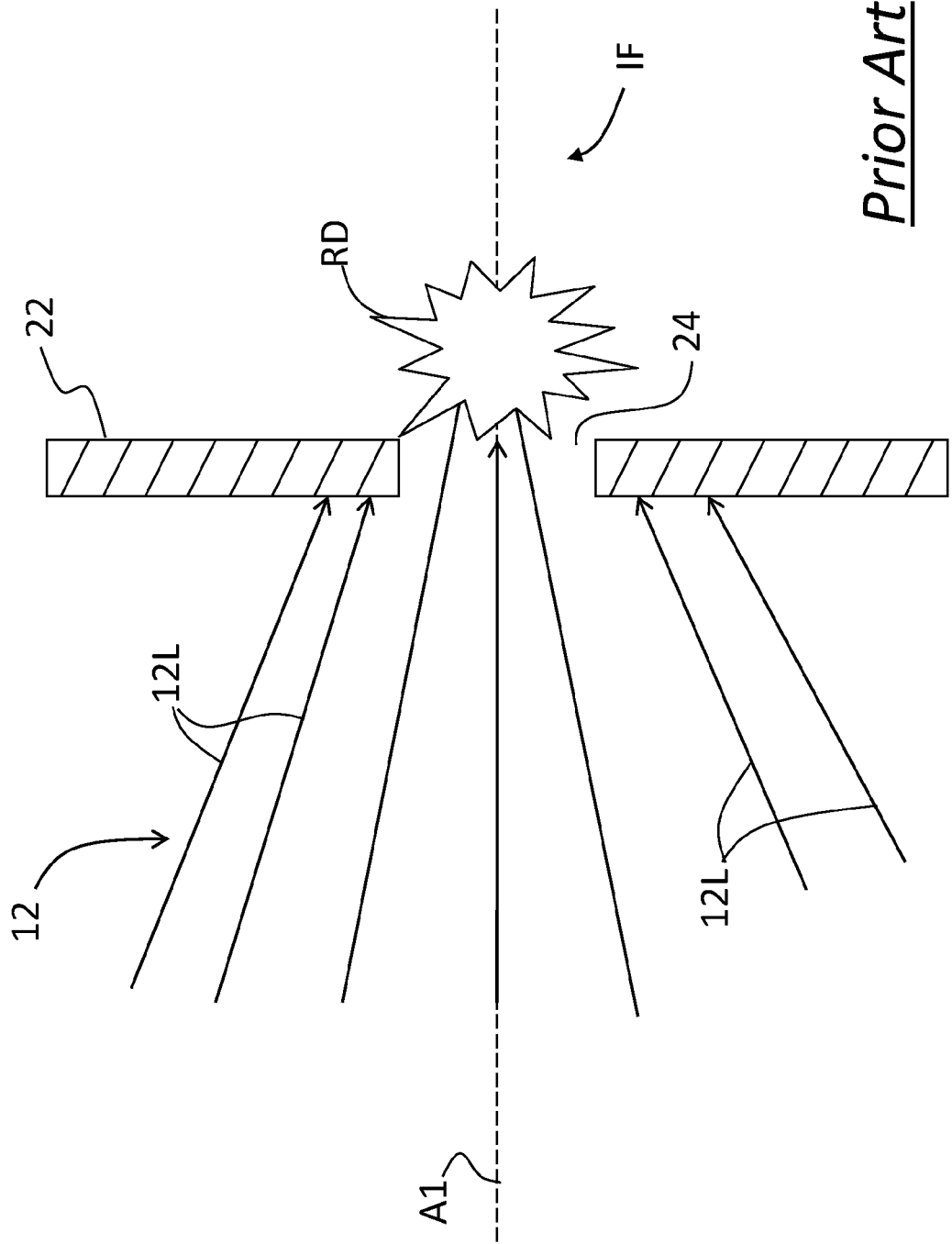
FIG. 3 is a close-up cross-sectional view of the entrance aperture, illustrating how a portion of the EUV radiation generally directed to the intermediate focus is blocked by the entrance aperture member.
Figure 4:
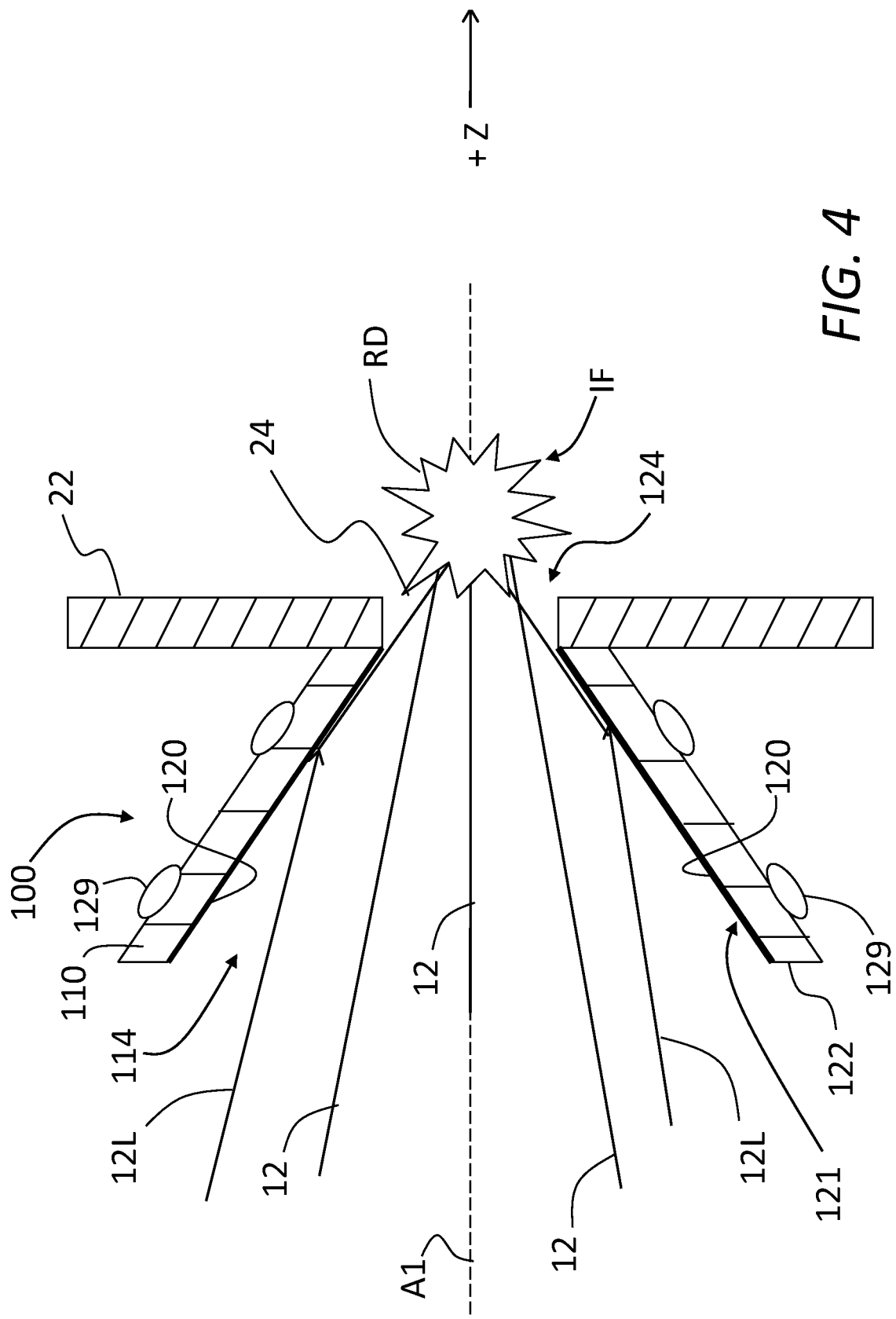
FIG. 4 is a close-up cross-sectional view similar to FIG. 3, but that includes an example RCED and that shows how the RCED redirects EUV radiation that would otherwise be lost to pass through the entrance aperture.

FIG. 4 is a close-up, cross-sectional view of an entrance aperture member 22 of illuminator 20 similar to FIG. 3, but showing an example RCED 100 arranged along central axis A1 and adjacent entrance aperture member 22 on the side closest to EUV radiation source RS (not show in FIG. 4; see e.g., FIGS. 1 and 2). RCED 100 has a body portion 110 that includes a central aperture 114 that, along with body portion 110, defines a tapered inner surface 120 that goes from wider at an input end 122 to narrower at an output end 124, i.e., the taper generally narrows in the +Z direction.

Inner surface 120 is designed to redirect at least a portion of EUV radiation 12L so that this EUV radiation 12L, which would otherwise not pass through entrance aperture 24 or that would pass through the entrance aperture 24 but with a less than optimum angle for use by the illuminator 20, passes through entrance aperture 24. In an example embodiment, inner surface 120 is smooth and covered with a coating 121 (single-layer or multi-layer, as described below) designed to enhance the reflectivity of the inner surface 120 at EUV wavelengths and the grazing incidence angles of EUV radiation 12L. Various forms for RCED 100 are discussed in greater detail below. In an example embodiment, RCED 100 is or includes a grazing-incidence mirror element. EUV wavelengths typically range from 10 nm to 15 nm, with an exemplary EUV wavelength being 13.5 nm.

In an example embodiment, inner surface 120 of RCED 100 is configured to match the numerical aperture (NA) requirements of illuminator 20. In another example, RCED 100 can be adjusted or swapped out for a different RCED to accommodate changes (e.g., NA changes) in illuminator 20. Generally, RCED 100 can be configured to match or otherwise accommodate particular angular distribution requirements of illuminator 20.

An aspect of the disclosure includes using RCED 100 to reduce the focusing requirements on the collector mirror (MN or MG) to allow the design of an illuminator 20 having a smaller entrance aperture 24 than could reasonably be accommodated by using a collector mirror (MN or MG) alone. This aspect of the disclosure can serve to simplify the collector requirements and/or illuminator design, which in turn reduces the collector and/or illuminator cost.

In an example, RCED 100 is disposed adjacent entrance aperture member 22 of illuminator 20, and can be attached to the entrance aperture member 22 or spaced apart therefrom. Attachment of RCED 100 to entrance aperture member 22 can be accomplished mechanically or magnetically so that the RCED 100 and the entrance aperture member 22 appear integrally formed, as shown in FIG. 4. A spaced-apart RCED 100 (discussed below in connection with FIG. 6) may be preferred in some instances to achieve specific performance goals, or for ease of manufacture and assembly. In such case, a stand-off mechanism may be configured to achieve a precise separation distance.

Figures 5A, 5B:
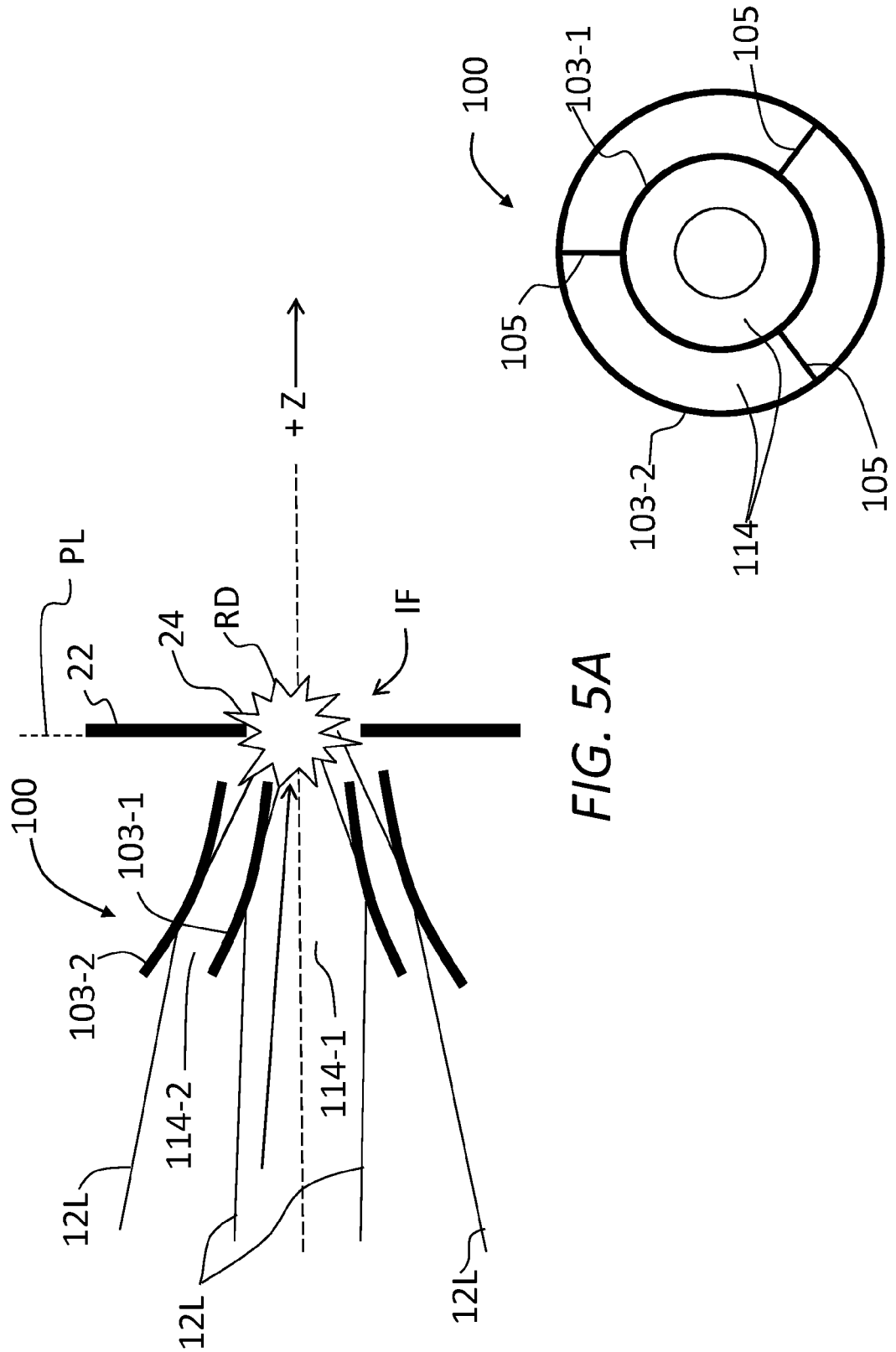
FIG. 5A is a cross-section view of an example multi-shell RCED.
FIG. 5B is a face-on view of the multi-shell RCED of FIG. 5A showing the spokes of a support structure ("spider") for the two reflective shells.

FIG. 5A is a cross-sectional view that illustrates an example RCED 100 that includes multiple inner surfaces 120, such as formed by concentrically arranged mirror shells 103-1 and 103-2. The concentric mirror shells 103-1 and 103-2 define two RCED apertures 114-1 and 114-2. FIG. 5B is a face-on view of RCED 100 of FIG. 5A showing spokes 105 of a support structure ("spider") that maintain the two mirror shells 103-1 and 103-2 in a spaced-apart and aligned configuration. Thus, RCED 100 generally includes at least one inner surface 120, and in certain embodiments includes multiple inner surfaces 120.

Figure 6:
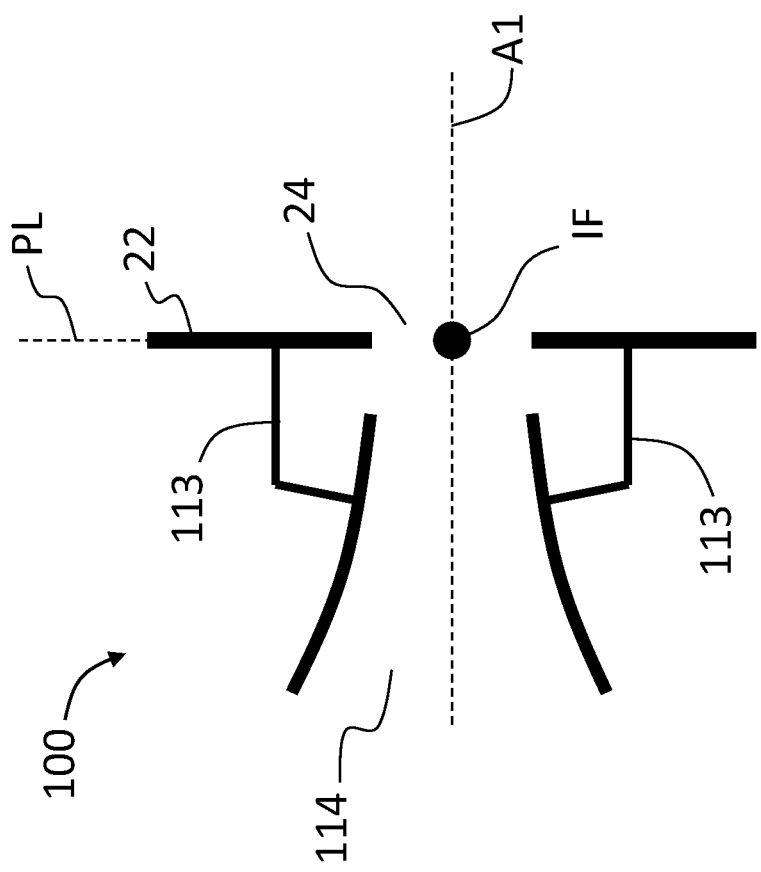
FIG. 6 is a schematic cross-sectional view of an example RCED that is spaced apart from the entrance aperture member and that is attached thereto via a support structure.

FIG. 6 is a schematic cross-sectional view of an example RCED 100 that is spaced apart from entrance aperture member 22 of illuminator 20, and that is attached thereto via a stand-off support structure 113. In FIG. 5A and in FIG. 6, the intermediate focus IF is shown as located in the plane PL defined by entrance aperture member 22 of illuminator 20. The intermediate focus IF represents the central location of the focused EUV radiation distribution formed by the GIC collector system 10G.

Figure 16:
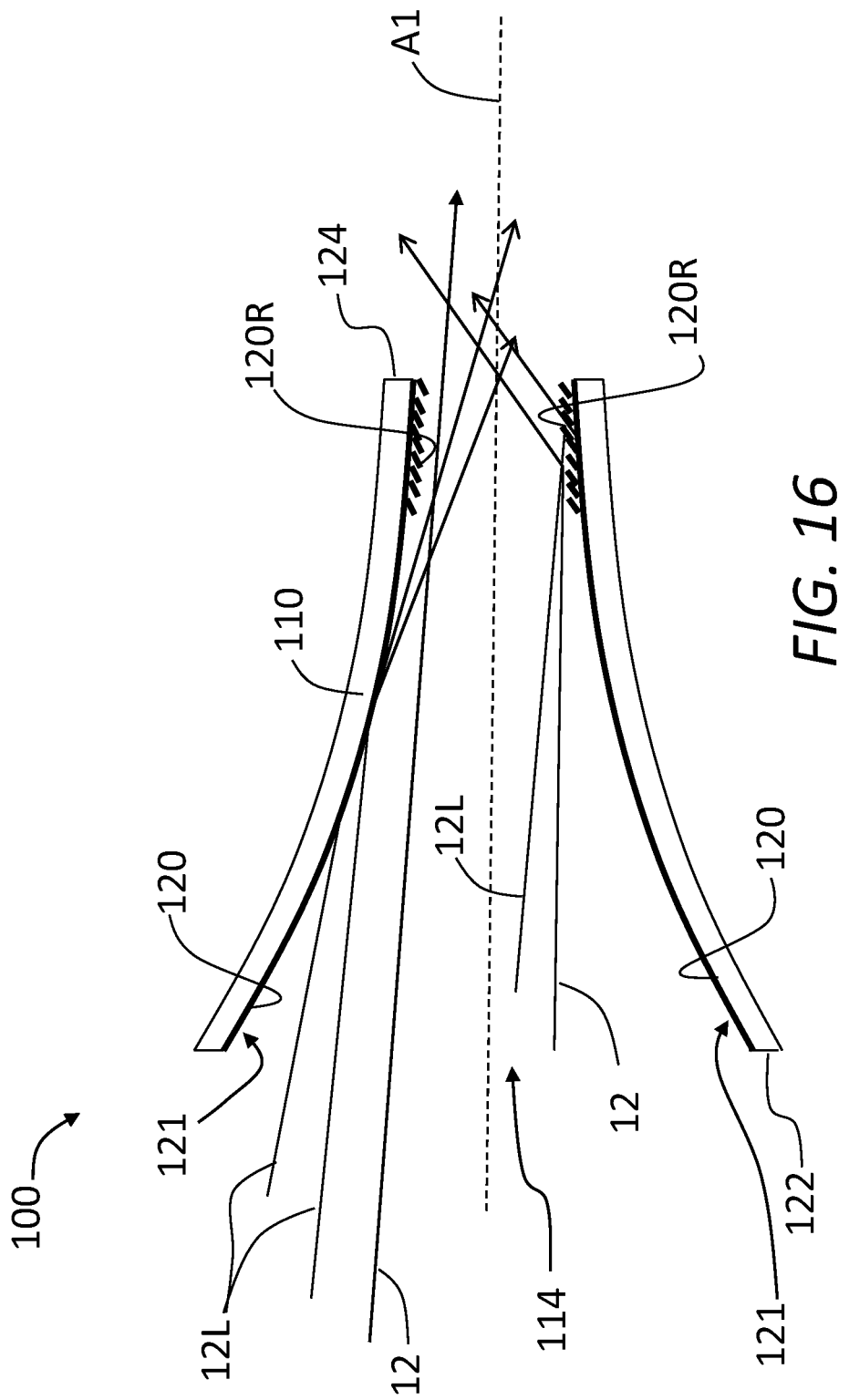
FIG. 16 is similar to FIG. 12 but includes a roughened inner surface portion adjacent the output end.

It is noted here that while RCED 100 redirects at least a portion of EUV radiation 12L that otherwise would not make it through entrance aperture 24 of illuminator 20, in some embodiments RCED 100 is configured to also redirect through the entrance aperture 24 at least some EUV radiation 12 that would in fact have made it through the entrance aperture 24 had it not been redirected (see, e.g., one of the scattered EUV radiation 12 in FIG. 16). In such an embodiment, the redirection of EUV radiation 12 that would have made it through the entrance aperture 24 anyway will typically be done to change the angular distribution of the EUV radiation 12 passing through entrance aperture 24 and thereby make such EUV radiation 12 better suited to meet the angular input requirements of the illuminator 20. In an example, the redirection of EUV radiation 12 is optimized to the angular distribution requirements of illuminator 20.

The output end 124 of RCED 100 can be smaller than entrance aperture 24 and still provide improved light collection. Experiments have shown that an RCED 100 with an output end 124 having a diameter of 4 mm passes substantially the same amount of EUV radiation 12 as a 6 mm entrance aperture 24 but resulted in a better angular distribution of the EUV radiation 12 in the far field.

NIC Collector with RCED

Figure 7:
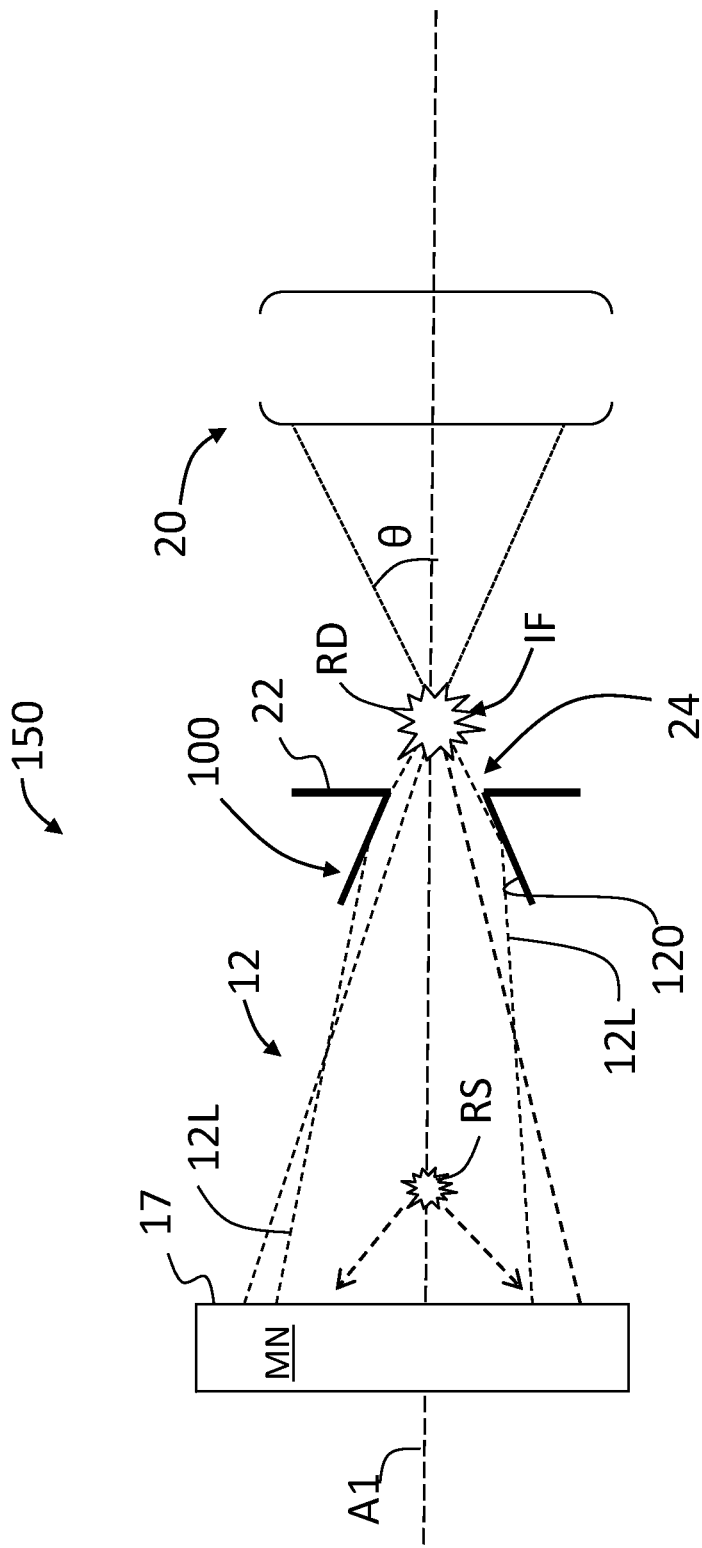
FIG. 7 is a generalized NIC collector system similar to that of FIG. 1, but with a RCED.
Figure 8:
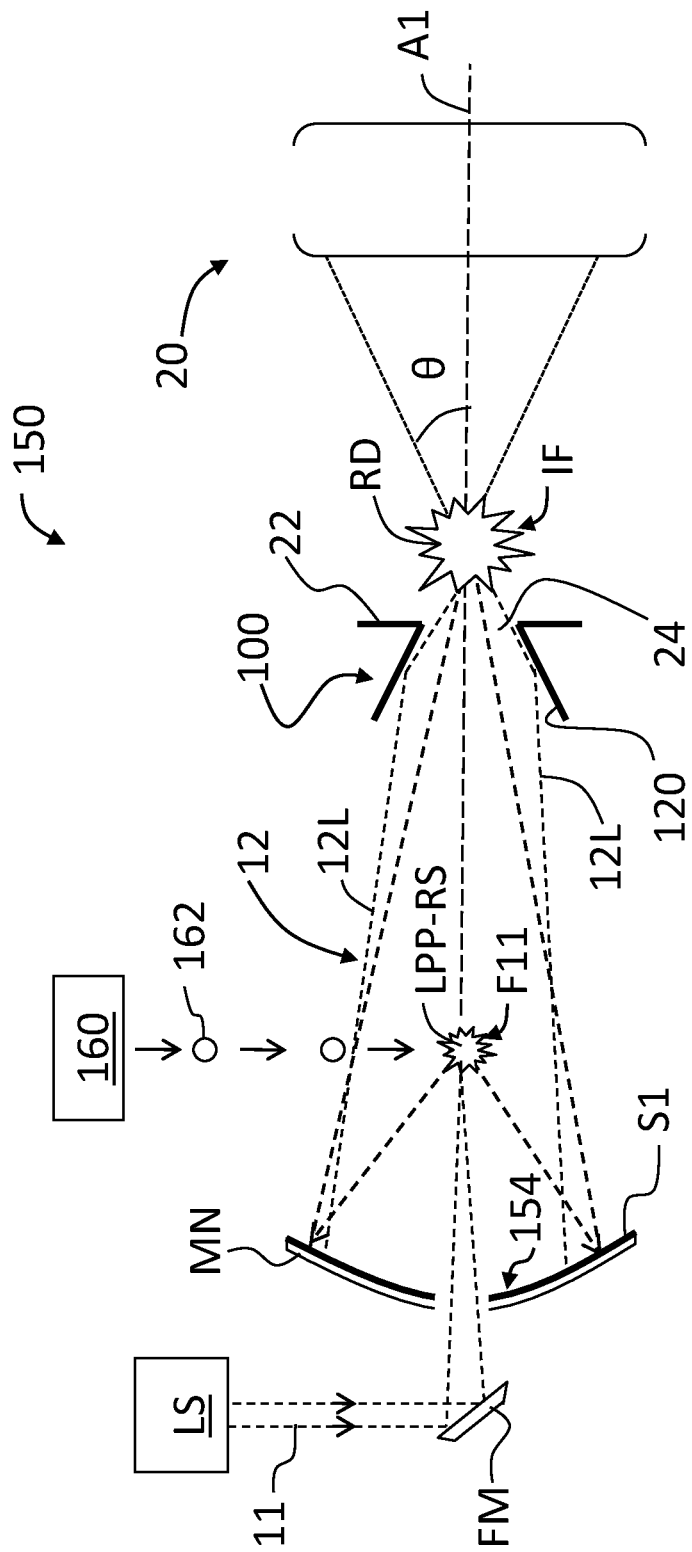
FIG. 8 is a more detailed schematic diagram of an example EUV NIC collector system and that includes a RCED and a LPP EUV source.

FIG. 7 shows a generalized NIC collector system 150 similar to NIC collector system 10N of FIG. 1, but with a RCED 100 arranged adjacent entrance aperture member 22 of illuminator 20. FIG. 8 is a more detailed schematic diagram of an example NIC collector system 150 based on the generalized NIC collector system 10N of FIG. 7.

FIG. 7 and FIG. 8 show the illuminator 20 acceptance angle θ that applies generally for both types of collector systems. The numerical aperture NA of illuminator 20 is given by NA=n·sin θ, where n is the refractive index of the medium, which is presumed to be a vacuum for an EUV lithography system (i.e., n=1).

With reference to FIG. 8, NIC collector system 150 includes a high-power laser source LS that generates a high-power, high-repetition-rate laser beam 11 having a focus F11. NIC collector system 150 also includes along a central axis A1 a fold mirror FM and a large (e.g., ~600 mm diameter) ellipsoidal NIC mirror MN that includes a surface S1 with a multilayer coating 154. The multilayer coating 154 provides good reflectivity at EUV wavelengths. NIC collector system 150 also includes a Sn source 160 that emits a stream of Sn pellets (or droplets) 162 that pass through and are irradiated by laser beam focus F11.

In the operation of NIC collector system 150, laser beam 11 from laser source LS irradiates Sn pellets (or droplets) 162 as the pellets (or droplets) pass through the laser beam focus F11, thereby produce a high-power laser-produced plasma source LPP-RS. Laser-produced plasma source LPP-RS typically resides on the order of a few hundred millimeters from NIC mirror MN and emits EUV radiation 12, as well as energetic Sn ions, particles, neutral atoms, and visible, UV and infrared (IR) radiation. The portion of the EUV radiation 12 directed toward NIC mirror MN is collected by the NIC mirror MN and directed (focused) toward entrance aperture 24 to intermediate focus IF to form intermediate radiation distribution RD.

As discussed above, some of the EUV radiation 12 (identified as 12L) has a trajectory that would be blocked by entrance aperture member 22. However, at least a portion of EUV radiation 12L is collected by RCED 100 and redirected through entrance aperture 24 of illuminator 20. This provides more EUV radiation 12 for forming a far-field radiation distribution RD, and thus more radiation for ultimately forming an image of the reticle at the wafer in an EUV lithography system.

Figure 12:
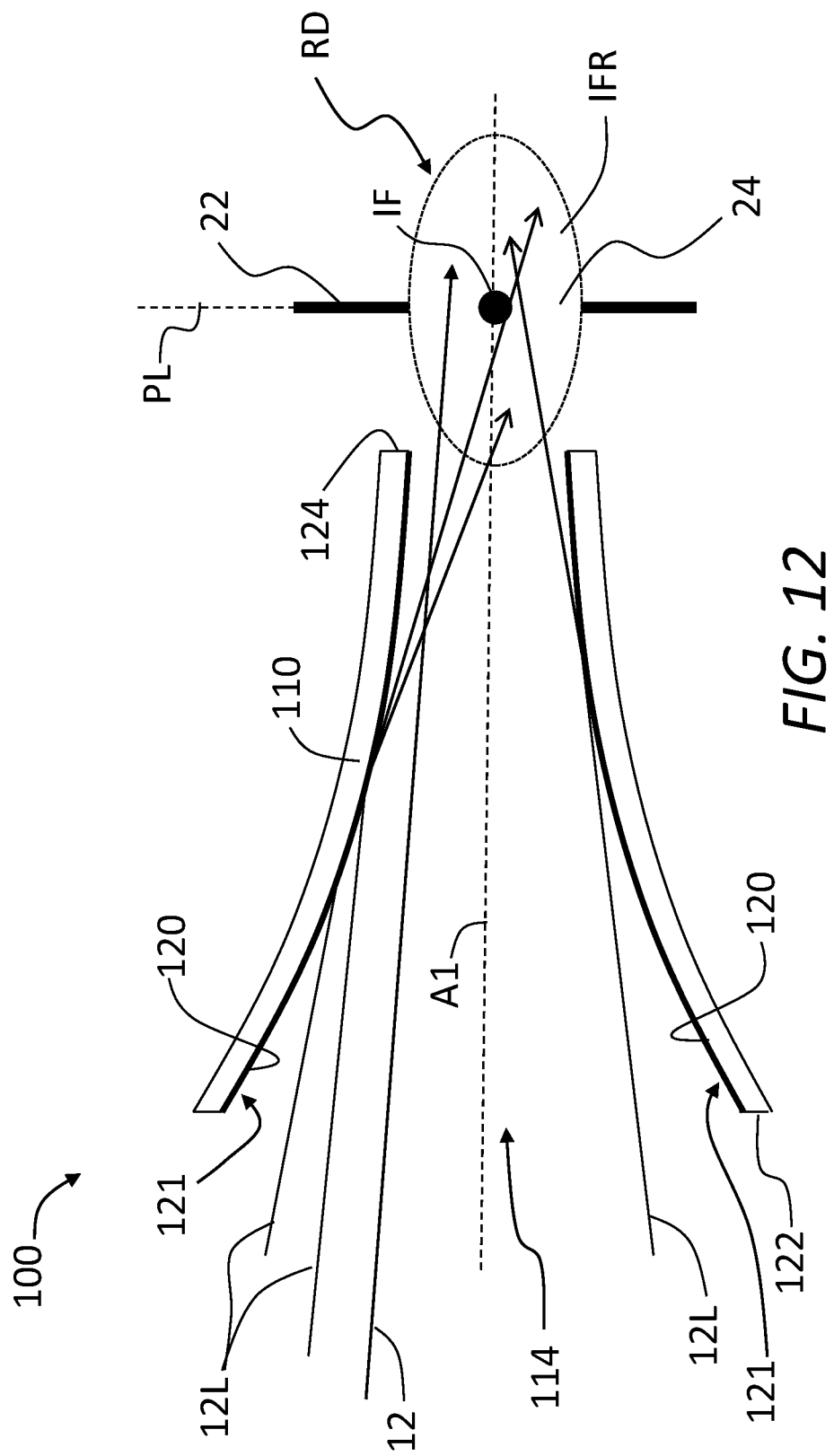
FIG. 12 is a side cross-sectional view of an example conic RCED having circular symmetry and curved walls.

It is noted here that the EUV radiation directed toward entrance aperture 24 by the EUV collector system is not tightly focused precisely at intermediate focus IF and does not generally form a perfectly uniform far-field radiation distribution RD. Rather, the radiation distribution RD formed by the collector system at the intermediate focus IF is somewhat ill-defined due to imperfections (aberrations) in the particular collector system used, as well as scattering effects in the collector system. Further, illuminator 20 is typically designed so that it does not require as an input a sharply focused spot or a crisply defined disk. FIG. 12, introduced and discussed below, shows an intermediate focus region IFR and that schematically illustrates a more realistic extent of the intermediate focus IF as caused by aberrations and scattering, and that is representative of the extent of an actual EUV radiation distribution.

Illuminator 20 typically is configured to receive EUV radiation that passes through entrance aperture 24 with a specified angular distribution and uniformity. The illuminator 20 serves to condense and uniformize this EUV radiation for uniformly illuminating the reflective reticle (usually to within a few percent (e.g., between 2% and 5% uniformity). Thus, RCED 100 may be designed to capture additional misdirected EUV radiation from the collector mirror and redirect it to meet the illuminator specifications, thereby enhancing illuminator performance, and in particular increasing the amount of EUV radiation that can be effectively used to illuminate the reticle in an EUV lithography system.

In an example embodiment, the NIC mirror MN or GIC mirror MG is formed with looser (reduced) tolerances than would otherwise be possible, and RCED 100 is used to compensate for the reduced tolerances, errors, misalignments, thermal distortions, etc. The combination of the collector mirror and RCED 100 can thus be used to meet the system tolerance at the intermediate focus plane PL for the radiation distribution RD. This approach makes it easier and likely less expensive to form the NIC or GIC mirror when such mirror is used in combination with a RCED 100.

GIC Collector with RCED

Figure 9:
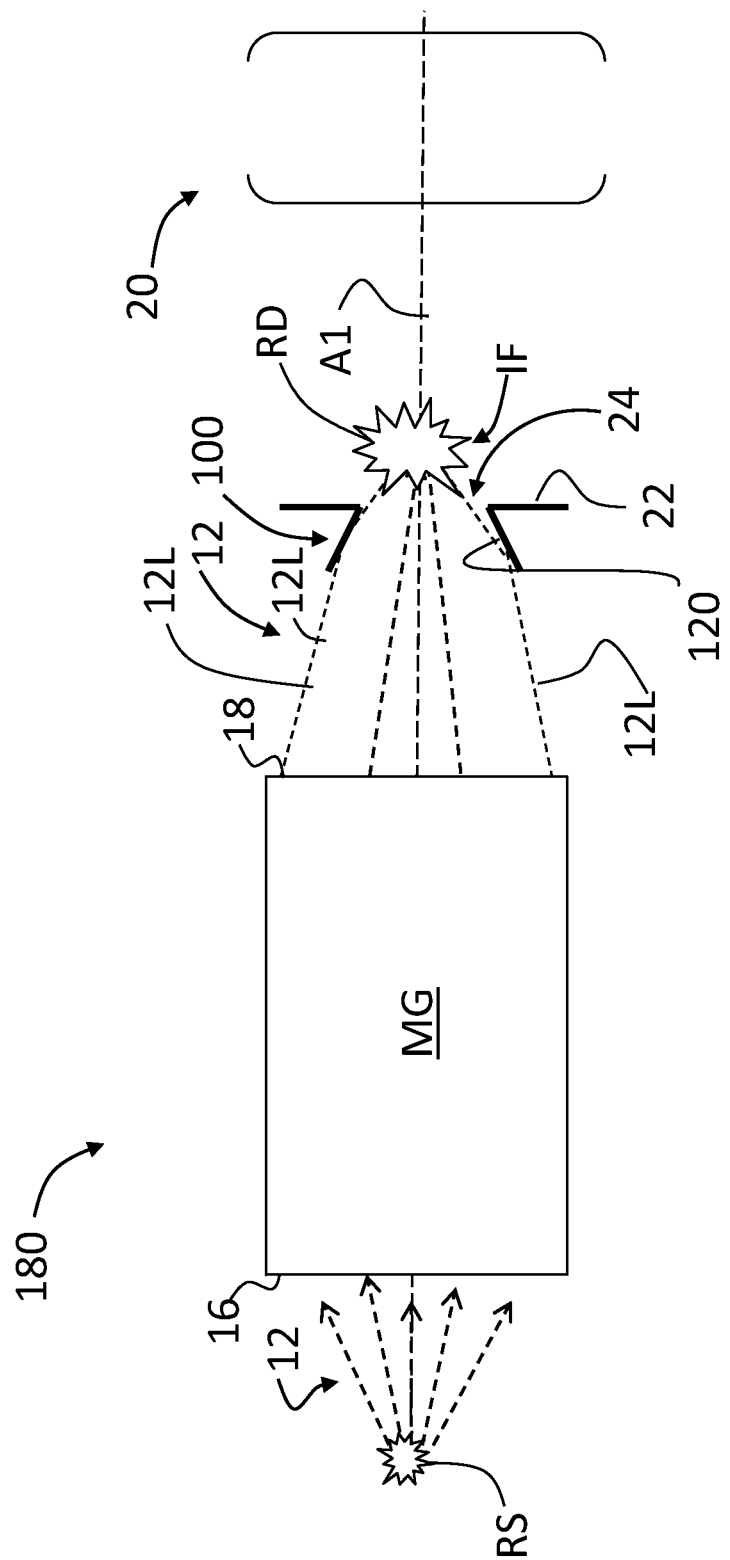
FIG. 9 is a generalized GIC collector system similar to that of FIG. 2, but with a RCED.
Figure 10:
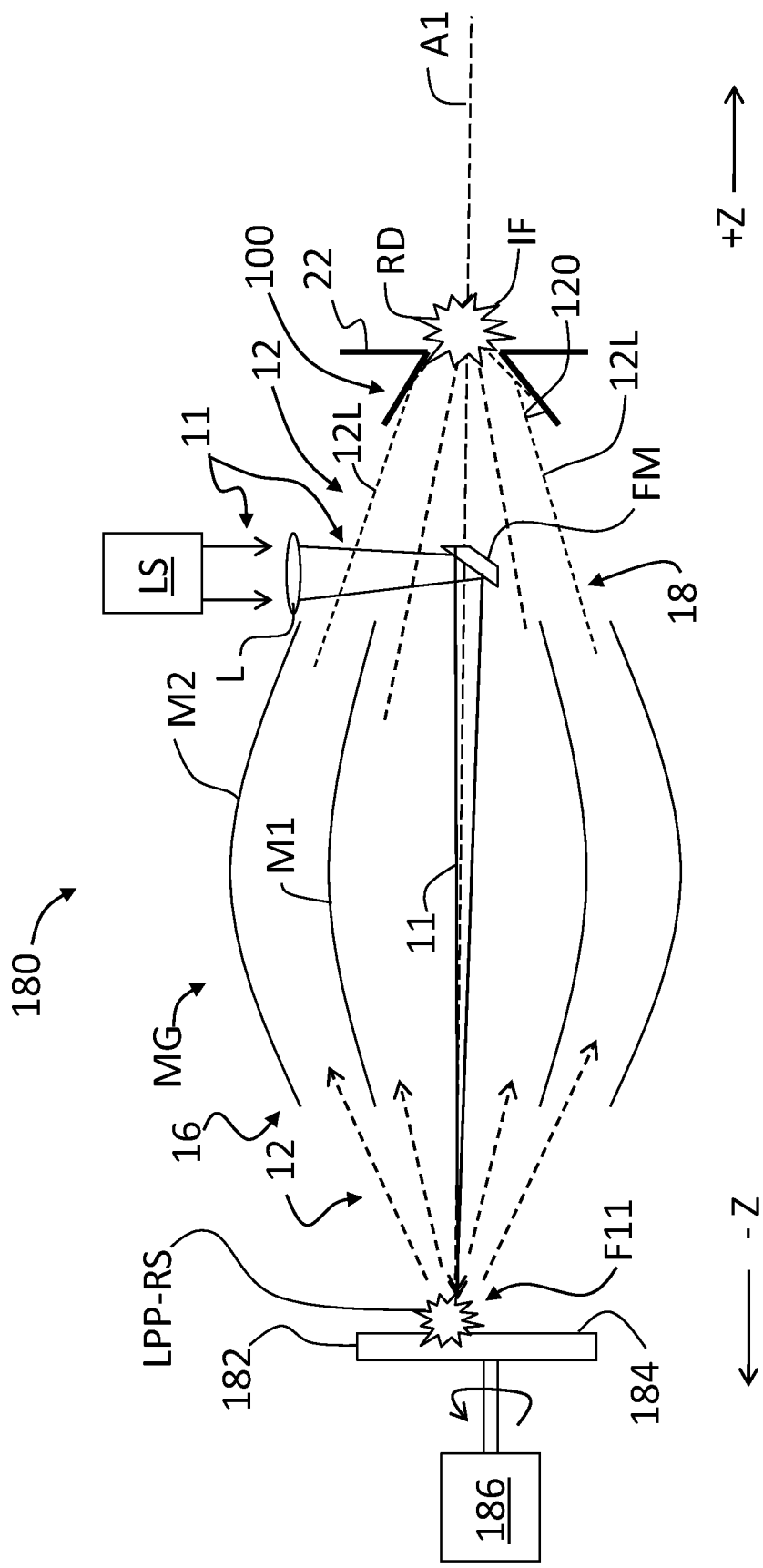
FIG. 10 is a more detailed schematic diagram of an example EUV GIC collector system and that includes a RCED and a LPP EUV source.

FIG. 9 shows a generalized GIC collector system 180 similar to GIC collector system 10G of FIG. 2, but with a RCED 100 arranged adjacent entrance aperture member 22. FIG. 10 is a more detailed schematic diagram of an example GIC collector system 180 based on the generalized GIC collector of FIG. 9.

GIC collector system 180 includes a laser source LS that generates a laser beam 11. GIC mirror MG is shown as having GIC shells M1 and M2 arranged along central axis A1. In practice, one or more GIC shells can be used. A lens L and a fold mirror FM serve to direct laser beam 11 along central axis A1 and through the GIC mirror MG in the −Z direction to a focus F11 on the opposite side of GIC mirror MG from laser source LS. In an example embodiment, GIC shells M1 and M2 include Ru coatings, which are relatively stable and can tolerate a certain amount of Sn coating. Note that fold mirror FM and laser beam 11 from laser source LS are shown located between GIC mirrors MG and the intermediate focus IF. An alternative arrangement places laser source LS and fold mirror FM between the input end 16 of GIC mirror MG and the laser beam focus F11.

A high-mass, solid, moving Sn target 182 having a surface 184 is arranged along central axis A1 so that a portion of the surface 184 of Sn target 182 is at focus F11. A target driver 186 (e.g., a motor) is shown for moving Sn target 182 by way of example. The laser beam-11 incident upon surface 184 of Sn target 182 forms laser-produced plasma source LPP-RS. Moving Sn target 182 at high speed allows for laser beam 11 to be incident upon surface 184 of Sn target 182 at a different location for each laser pulse.

The emitted EUV radiation 12 from laser-produced plasma source LPP-RS formed on Sn target 182 is generally in the +Z direction and travels through GIC mirror MG in the opposite direction of laser beam 11, i.e., in the +Z direction. Some of EUV radiation 12 passes directly through RCED 100 and to intermediate focus plane PL to form radiation distribution RD, while other EUV radiation 12L is collected by RCED 100 and directed through entrance aperture 24 by grazing-incidence reflection from reflective inner surface 120. As with the NIC collector system 150, this configuration provides more useful radiation (e.g. an angular distribution the better meets the illuminator specifications) passing through the intermediate focus aperture radiation for forming radiation distribution RD and thus more radiation for ultimately forming an image of the reticle at the wafer in an EUV lithography system.

While the example EUV radiation source has been described above as an LPP EUV radiation source, a discharge-produced plasma (DPP) EUV radiation source can also be used in connection with the embodiments of the present disclosure.

Example RCEDs

RCED 100 can have a wide range of configurations that have a generally tapered shape in the +Z direction when placed in front of (i.e. on the collector side of) the entrance aperture member 22, and a generally shape in the -Z direction when placed behind (i.e. on the illuminator side of) the entrance aperture member 22.

If the RCED 100 is intended to homogenize and otherwise improve the angular distribution of EUV radiation in the far field behind entrance aperture member 22 of illuminator 20, then it can have a fairly complex inner surface configuration. For example, the inner surface configuration can include a precisely contoured reflecting surface or an undulating surface or even a roughened inner surface configured to uniformize and otherwise optimize the EUV radiation coming from, for example, distributed shells of a multi-shell GIC mirror MG. On the other hand, if RCED 100 is intended to distribute EUV radiation to larger angles behind entrance aperture member 22 to optionally illuminate an alignment structure beyond the field of the illuminator 20, then the inner surface 120 of RCED 100 can be preferably configured to maximize the angles passing through entrance aperture 24 of illuminator 20. Or, if RCED 100 is only intended to maximize the amount of EUV radiation 12 through the entrance aperture 24 of illuminator 20, then inner surface 120 can be designed to have one or more surface configurations that achieve this goal.

Figure 11:
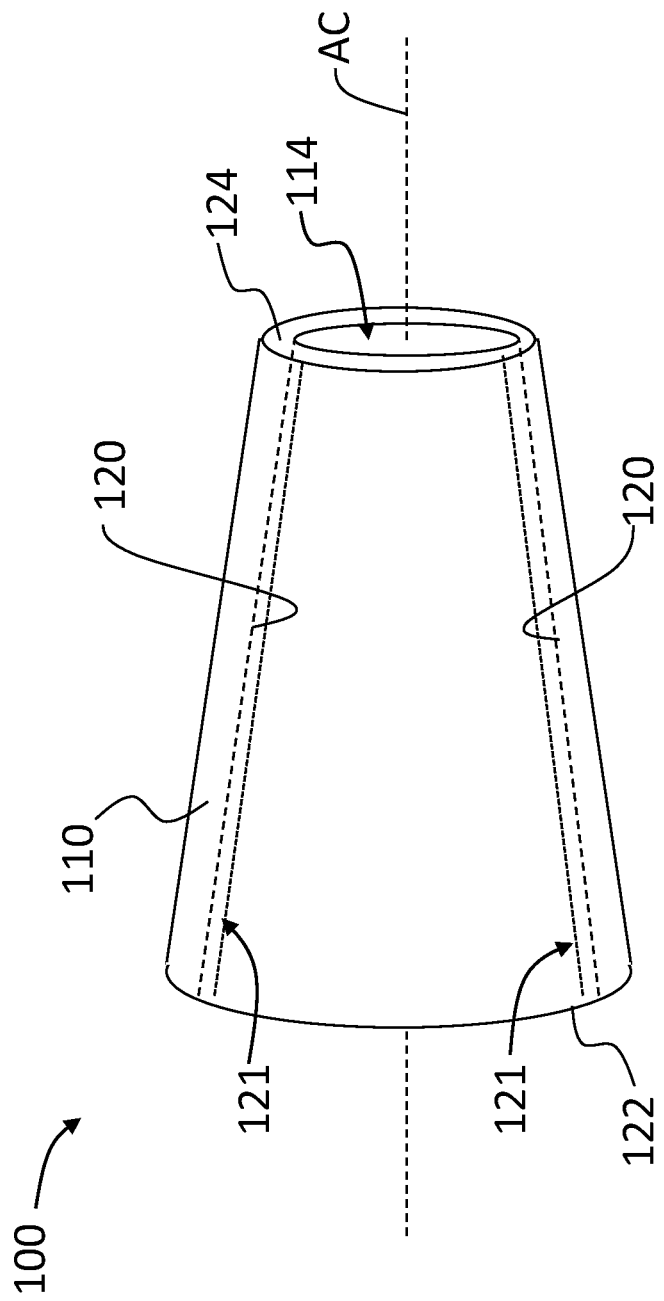
FIG. 11 is an isometric view of an example conic RCED having circular symmetry and linear walls.

FIG. 11 is an isometric view of an example RCED 100 that illustrates an example conic RCED 100 that has a reflective inner surface 120 with a linear taper. RCED 100 has a central axis AC. A coating 121 is shown on inner surface 120. The linear taper can be configured to correspond (e.g., match) the NA or the angular distribution of illuminator 20. A simple version of RCED 100 includes a polished inner surface 120 that, along with coating 121, grazingly reflects EUV radiation 12L.

FIG. 12 is a longitudinal cross-sectional view of an example RCED 100 that illustrates an example where the RCED 100 that has a reflective inner surface 120 with a curved (i.e., flared) taper. As discussed above, the curved taper can be configured to correspond (e.g., match) the NA or the required angular distribution of illuminator 20.

Figure 13:
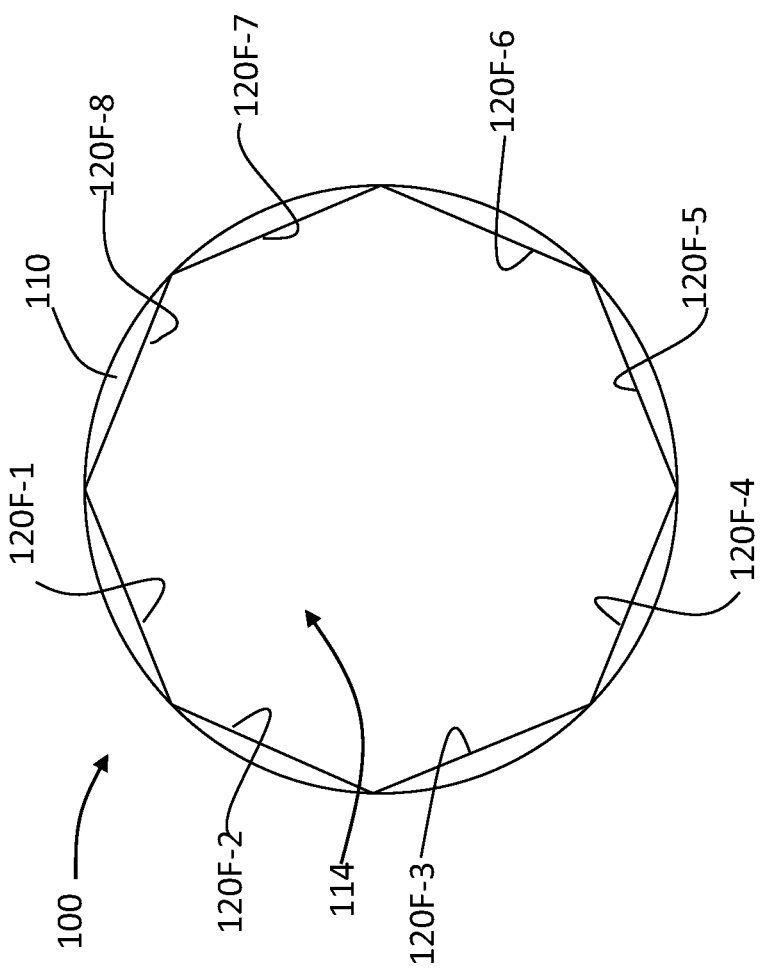
FIG. 13 is a cross-section view of an example RCED, where the inner wall includes a plurality of facets and has non-circular symmetry.

FIG. 13 is lateral cross-sectional view of an example RCED 100 that has an inner surface 120 that is not rotationally symmetric and that has a plurality of (e.g., eight) inner surfaces 120F-1 through 120F-8. The faceted inner surface 120F can be, for example, linearly tapered or curved tapered.

Figure 14:
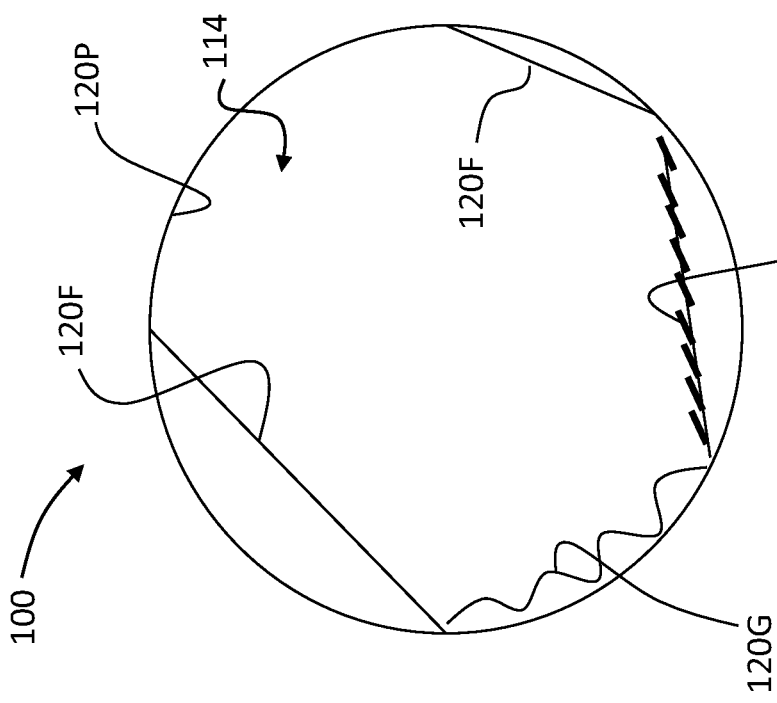
FIG. 14 is a cross-sectional view of an example RCED, where the inner wall includes a variety of different configurations such as planar, roughened, undulating and curved polished.

FIG. 14 is similar to FIG. 13, and shows an example RCED 100 having a variety of inner surfaces 120, such as one or more inner surface 120F, an undulating or grooved inner surface 120G, a roughened inner surface 120R and a polished, curved inner surface 120P. Such a multi-form inner surface 120 may be employed for specialized applications.

Figure 15:
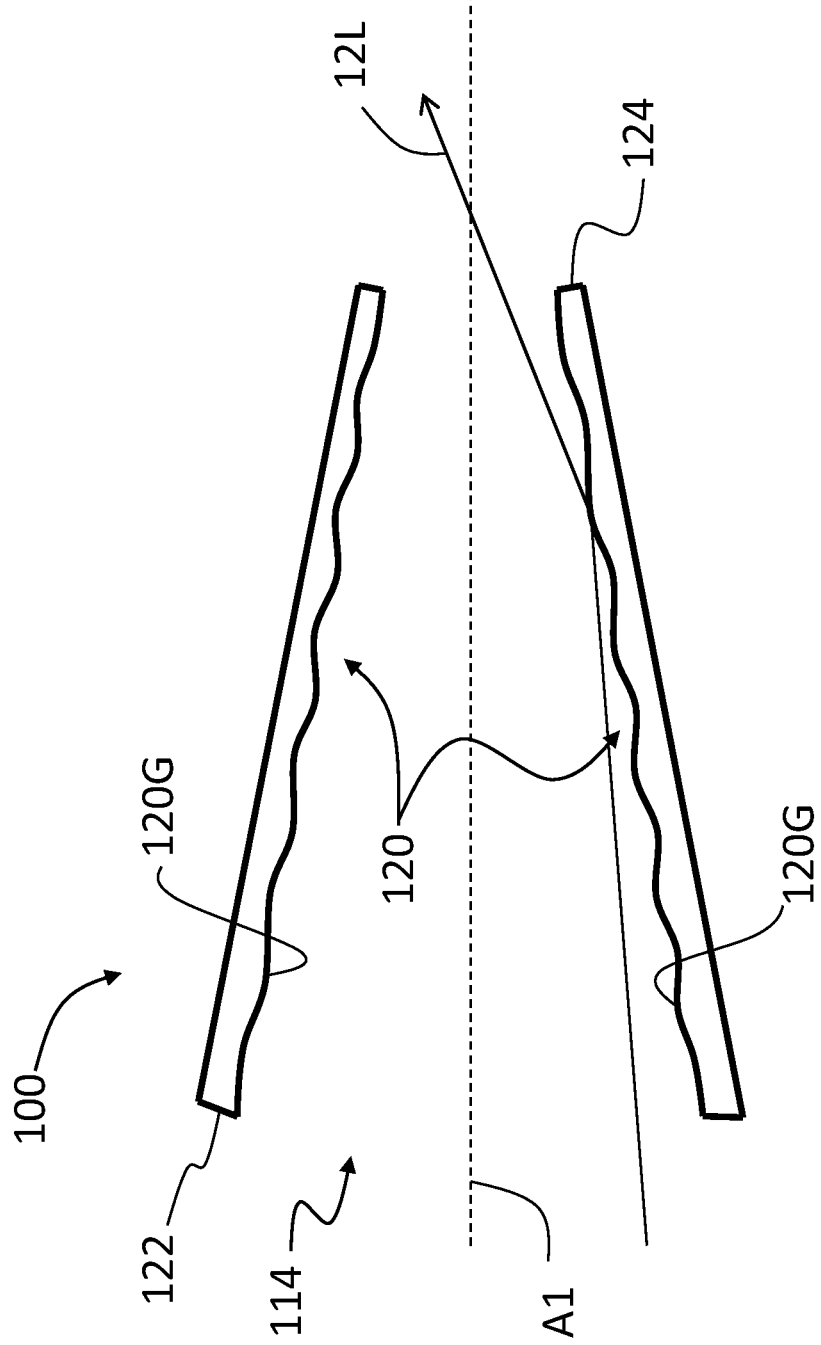
FIG. 15 is a lateral cross-sectional view of an example RCED where the inner surface includes an undulating surface.

FIG. 15 is a lateral cross-sectional view of an example RCED 100 where inner surface 120 includes an undulating or grooved inner surface 120G. Such an inner surface 120G can serve to smooth out or otherwise optimize the far-field EUV radiation distribution RD without using scattering from a high-spatial-frequency roughened surface.

FIG. 16 is similar to FIG. 12, but includes a portion of roughened inner surface 120R adjacent output end 124. The portion of Roughened surface 120R serves to provide wider scattering angles for EUV radiation 12L than a polished inner surface 120 (e.g., 120P; see FIG. 14), and serves to uniformize or otherwise improve (or optimize) the EUV radiation distribution RD at entrance aperture 24 of illuminator 20.

Body portion 110 of RCED 100 may be formed from a metal, a ceramic, a plastic or a glass or glass-like material. In an example, body portion 110 (including inner surface 120) of RCED 100 is smooth and has a controlled high-spatial-frequency roughness (as understood in the art of EUV mirrors) to control scattering. However, example embodiments include cases where inner surface 120 (and optional coating 121) are configured with a surface roughness configured to generate a select scattering (e.g., a broad scattering) of EUV radiation collected by the RCED 100, as discussed above in connection with FIG. 16. If body portion 110 of RCED 100 is made of a plastic or other material that can be cast, then it can indeed be made very inexpensively and with a high degree of surface smoothness limited only by the smoothness of the master cast. Such a plastic or other non-metal RCED substrate can be coated with a high-atomic-number material (e.g., Ruthenium) to improve or optimize the grazing incidence reflection from the inner surface 120 of RCED 100.

If RCED 100 is to be subjected to a significant thermal load, then a preferred body material may be a metal. In an example embodiment, a metal body portion 110 of RCED 100 has an inner surface 120 that is polished to a desired smoothness, or is electroformed. Example metals for body portion 110 of RCED 100 include stainless steel, nickel, copper, aluminum, and like metals that can be highly polished. Another example material for body portion 110 of RCED 100 is a thermally resistant material such as ZERODUR. In an example embodiment, body portion 110 of RCED 100 is configured to support a cooling mechanism, such as cooling channels 129 (see FIG. 4).

As discussed above, inner surface 120 may include a reflective coating 121 tailored to optimize the reflectivity of EUV radiation 12 at grazing incidence. While Ru is a preferred coating material, other high-atomic-number materials—such as Cu, Au, Pd, Sn, Pt, and Au—can also be used, as long as the specific application would not prohibit the use of such a coating. In addition, a resonant multilayer coating 121 can be used. Such a coating 121 would serve to broaden the acceptance angle and can increase the efficiency of RCED 100. An example multilayer coating 121 includes layers of Mo and Si.

RCED with Front and Rear Sections

The amount of EUV radiation 12 that can be transferred from radiation source RS through GIC mirror MG and to illuminator 20 is limited by the overall system etendue, and in particular the design input etendue of the illumination system. However, in the case of a grazing incidence collector it is worth noting that the etendue of the individual GIC shells (M1, M2, etc.) will typically be considerably smaller than that of the illuminator 20, and that the far-field EUV radiation distribution RD from the GIC will have gaps due to the nature of the separated shells. Thus, much of the EUV radiation 12P (Refer to FIG. 17) that would be lost can be recovered by RCED 100 without violating the etendue principle, and in particular without exceeding the etendue of the illuminator 20. Indeed, the RCED 100 can be used to redistribute the angular distribution of the far field radiation to better match the input angular distribution specifications of the illuminator 20 without violating the optical invariant (i.e., the etendue principle).

As discussed above, much of the recovered EUV radiations 12P gets directed into dark spaces on either side of the unaided far-field images formed by the GIC mirrors MG. This serves to homogenize and further optimize the far-field radiation distribution RD.

Figure 17:
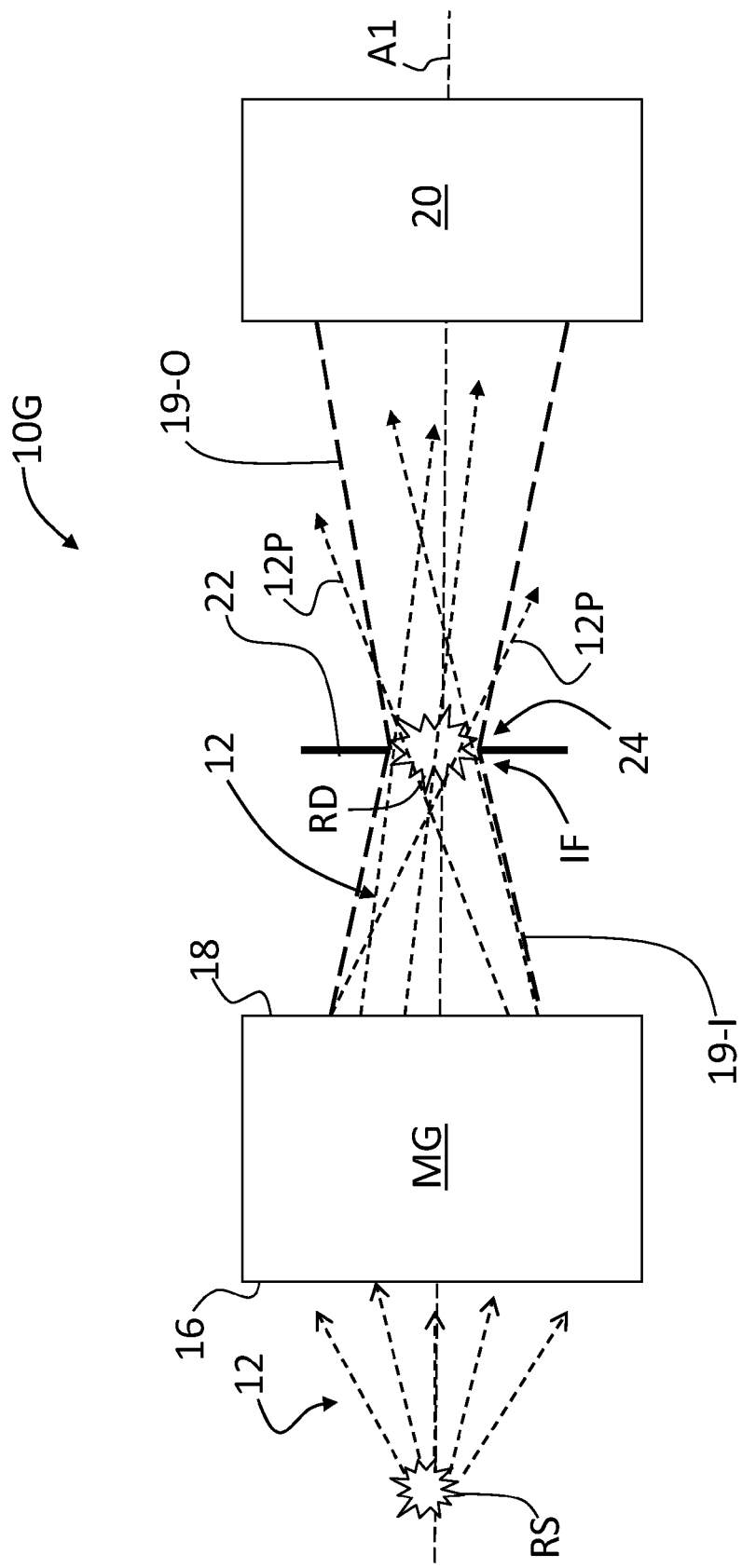
FIG. 17 is a schematic diagram similar to FIG. 2 and shows an example GIC collector system 10G with illuminator 20, illustrating the etendue limitations associated with transferring the EUV radiation from the radiation source to the illuminator.

FIG. 17 is a schematic diagram similar to FIG. 2 and shows an example GIC collector system 10G with illuminator 20. Illuminator 20 and entrance aperture member 22 define input and output acceptance angle limits 19-I and 19-O on the input and output sides of the entrance aperture 24. Even for the EUV radiation 12 that passes through entrance aperture member 22, some of this EUV radiation 12P has an angle relative to central axis A1 that precludes this radiation from entering and being processed by illuminator 20. This is because the image formation process associated with GIC collector system 10G is imperfect and is generally directed to trying to get as much EUV radiation 12 as possible from radiation source RS to illuminator 20.

Figure 18A:
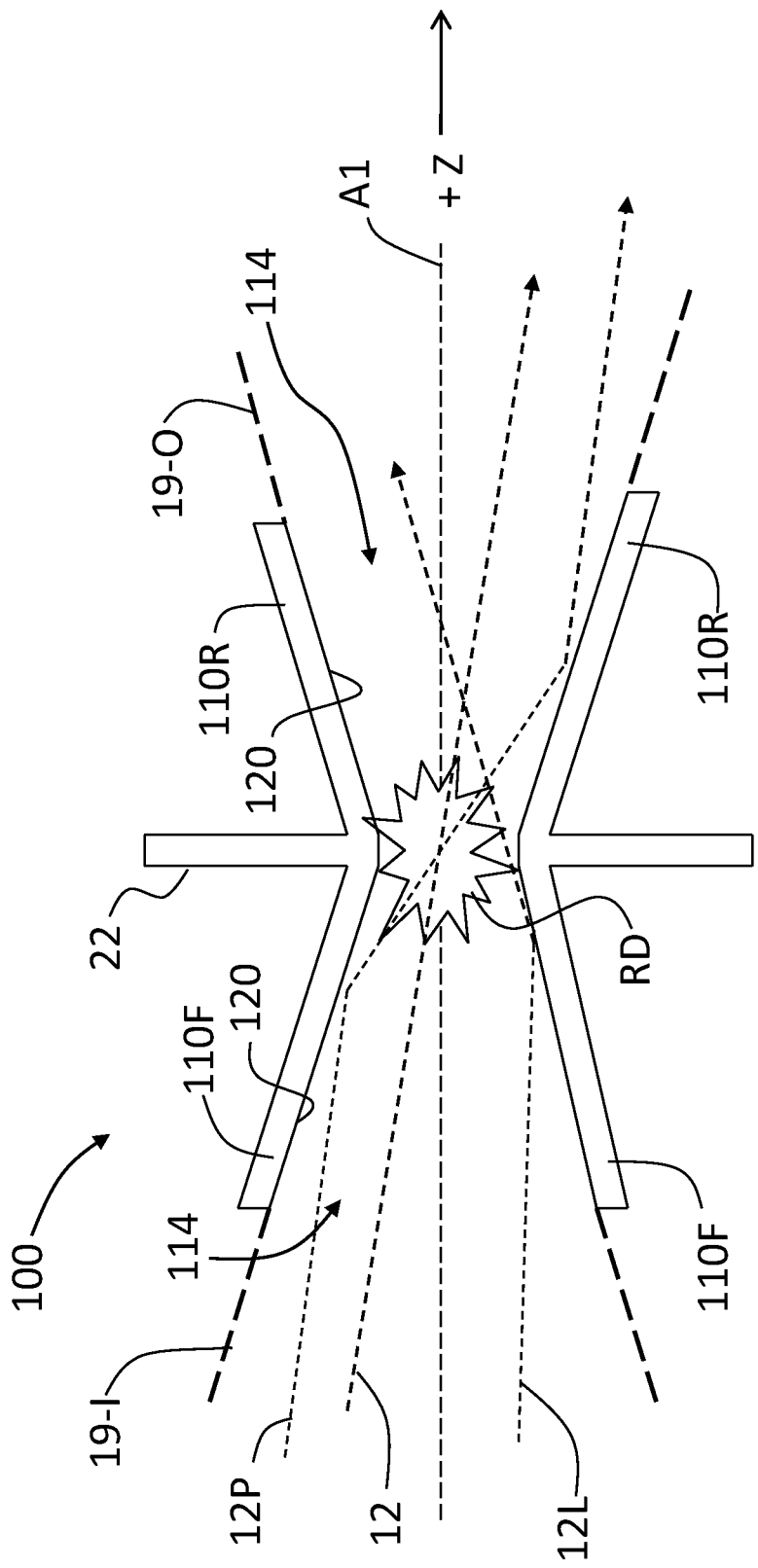
FIG. 18A is similar to FIG. 4 and illustrates an example embodiment where the RCED includes front and rear tapered bodies (sections) on either side of the aperture member.
Figure 18B:
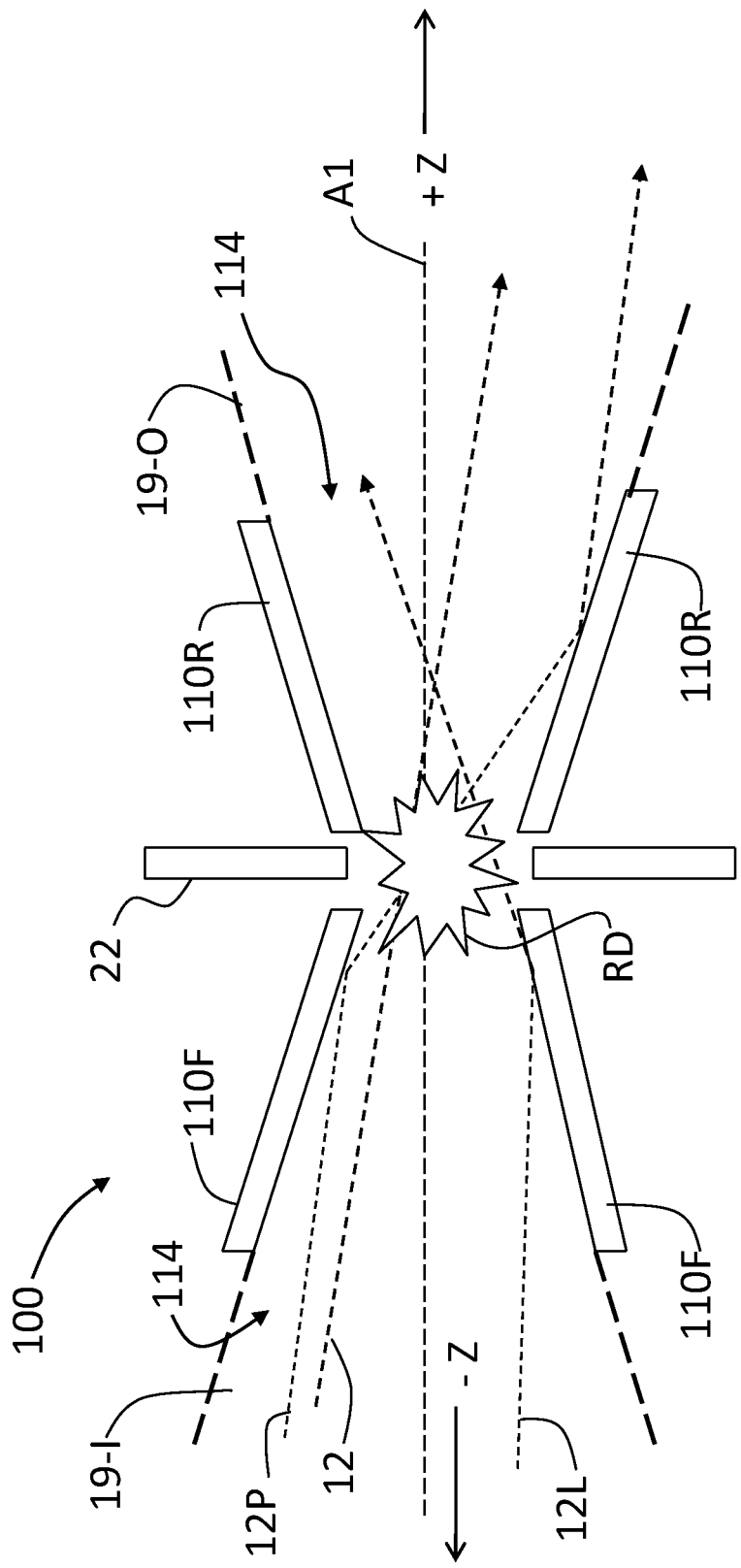
FIG. 18B is similar to FIG. 18A, except that the tapered bodies are separated from the aperture member.

With reference to FIG. 18A, in an example embodiment RCED 100 includes front and rear sections 110F and 110R on either side of entrance aperture member 22. FIG. 18B is similar to FIG. 18A, except that the front and rear sections 110F and 110R are separated from entrance aperture member 22. FIGS. 18A and 18B illustrate EUV radiation 12 that passes through RCED 100 with no bounces (12), one bounce (12L) and two bounces (12P).

Note that the front and rear sections 110F and 110R can also be considered separate RCEDs with possibly different curvatures or patterning on the front RCED versus the rear RCED. Accordingly, so the description of these sections 110F and 110R as being part of one RCED 100 or as being two different RCEDs is the same, and in some instances herein, front and rear RCED sections are referred to simply as front and rear RCEDs. In an example, front and rear sections 110F and 110R are axially tapered in opposite directions, as shown.

Figure 19:
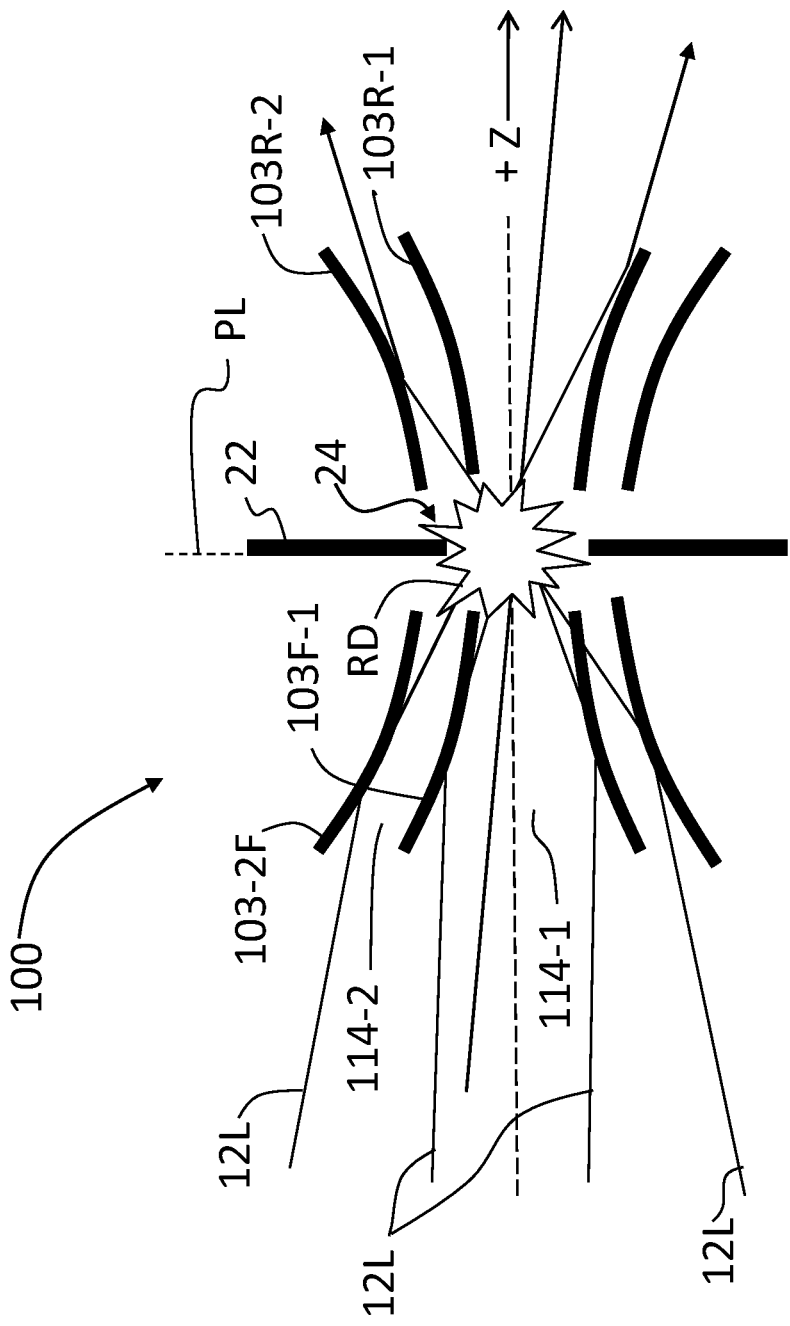
FIG. 19 is similar to FIG. 5A and illustrates an example RCED that includes multiple inner surfaces on either side of the aperture member.

FIG. 19 is similar to FIG. 5A and illustrates an example RCED 100 that includes multiple inner surfaces 120 on either side of entrance aperture member 22, such as formed by two sets of concentrically arranged mirror shells, namely front mirror shells 103F-1 and 103F-2, and rear mirror shells 103R-1 and 103R-2. Each of the mirror shells 103F-1, 103F-2, 103R-1 and 103R-2 can be considered sections of RCED 100 or even a separate RCED 100.

Once again, it is noted that front section 110F may have one or more surfaces whereas rear section 110R may have a number of surfaces different from the front section 110F. Similarly, front section 110F may be separated from the entrance aperture member 22 while rear section 110R may be attached to or separated from the entrance aperture member 22, or vice versa.

Figure 20:
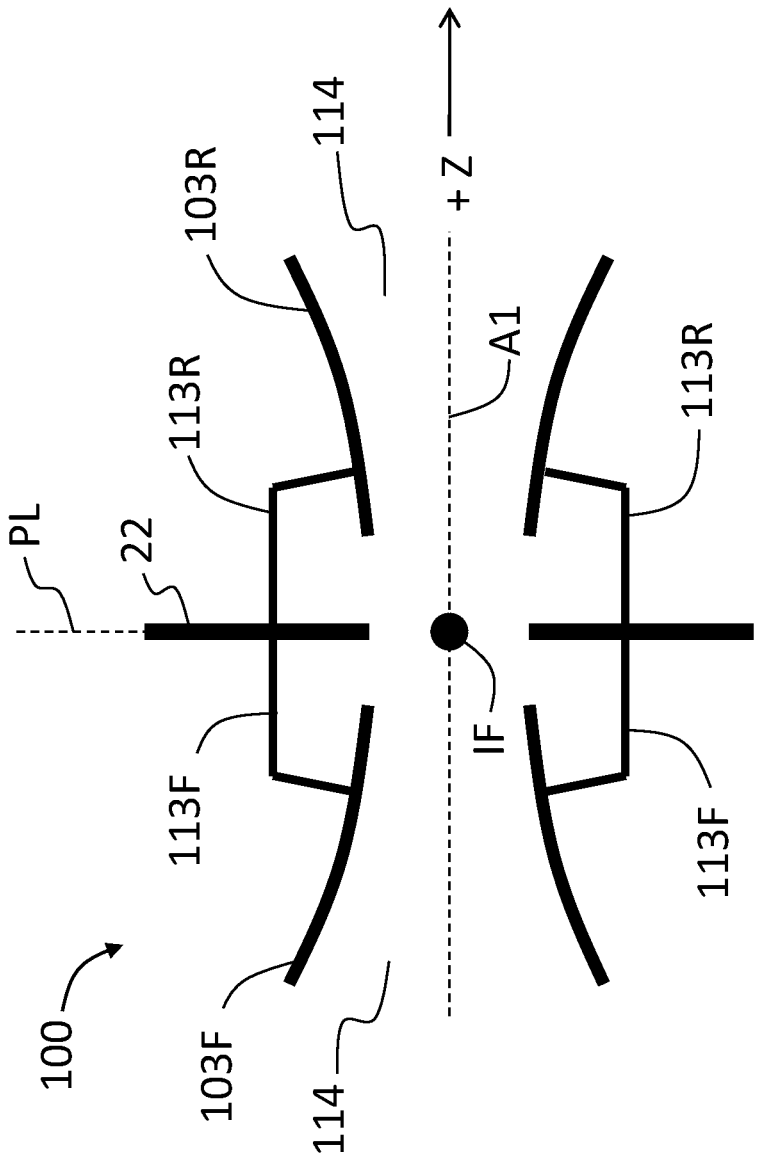
FIG. 20 is similar to FIG. 6 and illustrates another example RCED that includes a single front mirror shell and a single rear mirror shell as stood off from aperture member by respective stand-off support structures.

FIG. 20 is similar to FIG. 6 and illustrates another example RCED 100 that includes a single front mirror shell 103F and a single rear mirror shell 103R as stood off from entrance aperture member 22 by respective stand-off support structures 113F and 113R. Front and rear mirror shells 103F and 103R can also be considered as separate RCED sections or as separate RCEDs with different curvatures, different stand-offs, and a different number of surfaces between the front and rear RCEDs, etc.

Figure 21:
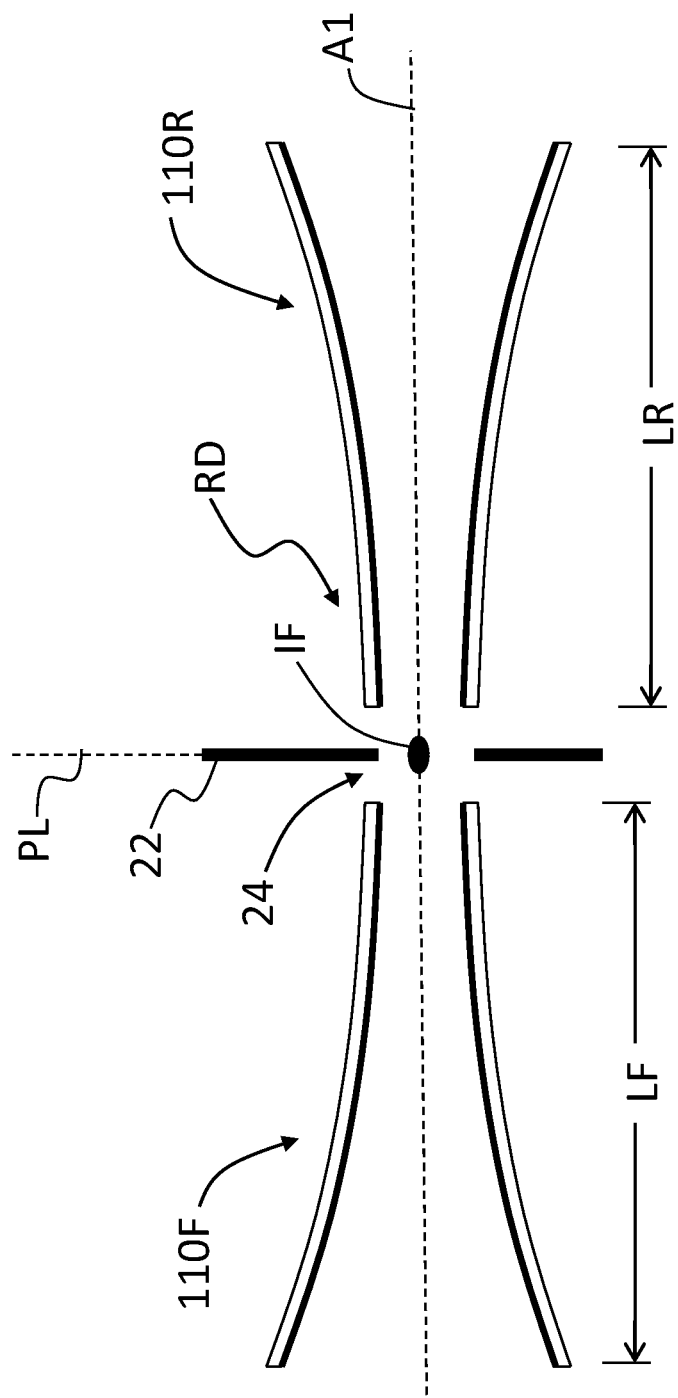
FIG. 21 is similar to FIG. 16 and illustrates another example RCED having front and rear tapered bodies on either side of the aperture member.
Figure 22:
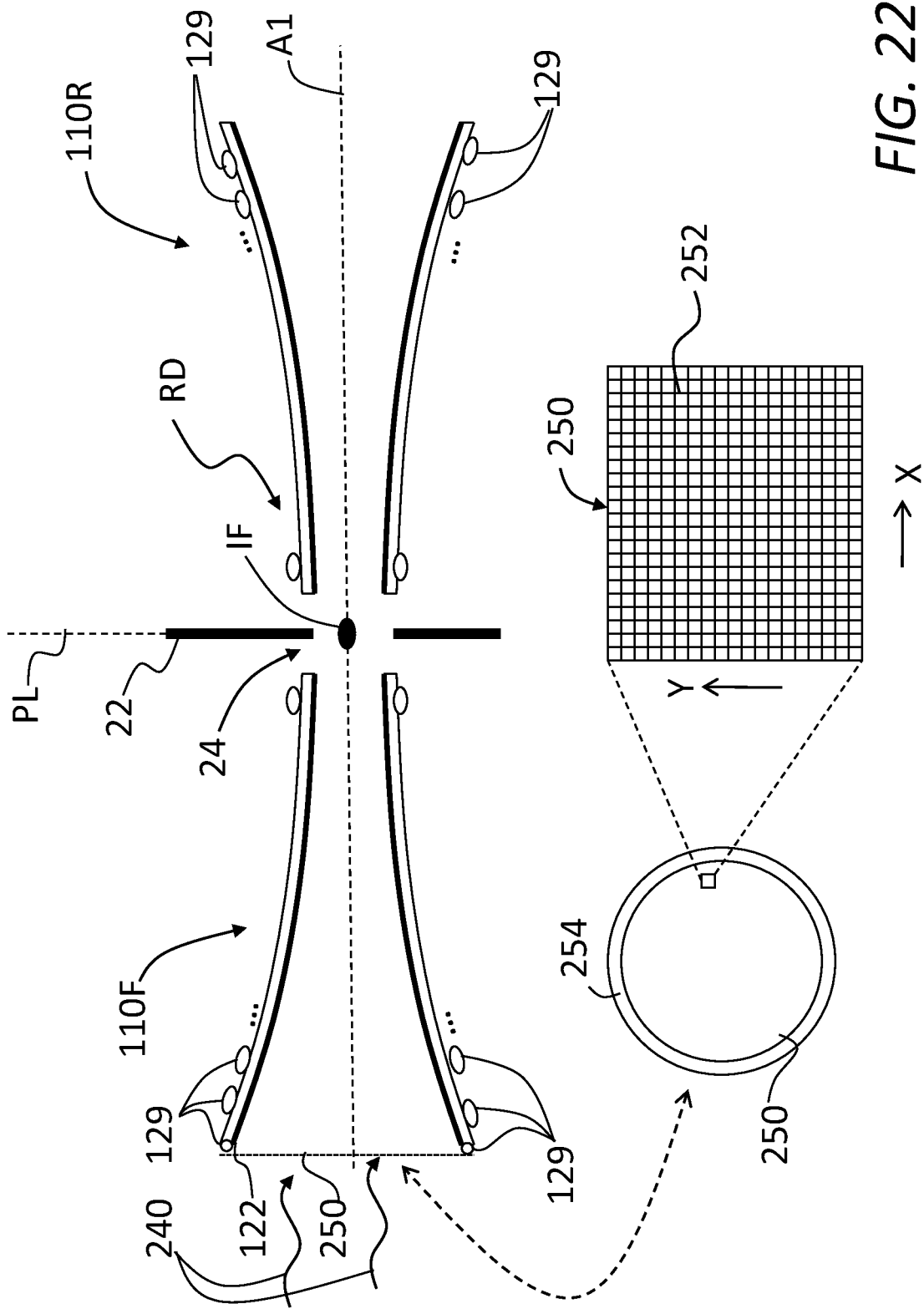
FIG. 22 is similar to FIG. 21 except that the RCED includes cooling channels on its outer surface.

FIG. 21 is similar to FIG. 16 and illustrates another example RCED 100 having front and rear sections 110F and 110R on either side of entrance aperture member 22. Front and rear sections 110F and 110R have respective axial lengths LF and LR, and in an example have an axial taper, as shown. FIG. 22 is the same as FIG. 21 and includes cooling channels 129 arranged on each of the sections 110F and 110R to cool these sections by flowing a cooling fluid through the cooling channels 129. In an example, one of the cooling channels 129 runs around the input end 122. As discussed above, front and rear sections 110F and 110R can also be considered as separate RCED sections or as separate RCEDs with different curvatures, different cooling configurations, different stand-offs, and different number of surfaces between the front and rear RCEDs, etc.

A desirable feature in a collector system is the ability to filter out unwanted broadband infrared radiation 240 generated by the EUV radiation source RS. Thus, with reference again to FIG. 22, an IR filter 250 is disposed adjacent input end 122 or output end 124 of front section 110F. Other locations for IR filter 250 are also possible. IR filter 250 is configured to filter out broadband infrared radiation 240 that may also be collected and reflected by the grazing incidence or normal incidence collector and delivered to entrance aperture member 22.

In an example embodiment, IR filter 250 comprises a low-density, free-standing grating having crossed-grating lines 252 (see insets, FIG. 22) and a support frame 254. The crossed-grating lines 252 have a period smaller than the wavelength of infrared radiation 240. If the areal density of crossed-grating lines 252 is relatively low (e.g. only 3% areal density coverage with metal crossed-grating lines 252) then the filtration of the infrared radiation 240 can be high while letting most (e.g. ~97%) of the EUV radiation pass through. Where IR filter 250 has metal crossed-grating lines 252, it can be thermally attached to the cooled RCED 100 to carry away any thermal load to which it may be subjected.

Thus, an aspect of the methods disclosed herein includes filtering infrared radiation 240 from the EUV radiation source RS immediately upstream or downstream of the at least one redirecting surface associated with RCED 100.

An example method of making a suitable crossed-grating-based IR filter 250 is now described. To filter infrared radiation 240 while transmitting EUV radiation, the grating period needs to be less than the IR radiation wavelength. Also, since a substrate will generally absorb EUV radiation, it is preferred that the grating be freestanding, or alternatively, the supporting substrate be very thin (i.e., membranous) and be made of a material that has low absorption at 13.5 nm. For example, a half-micron thick Si membrane would reduce the EUV transmission at 13.5 nm by about a factor of 2×. If a 0.1 micron thick Si membrane were used, it would have a transmission at 13.5 nm of about 87%, which might be deemed acceptable.

For a linear grating in the vertical (Y) direction, polarization components of the infrared radiation 240 in the Y direction would get reflected, with some absorption in the metal of the grating depending on its conductivity. To reflect all polarization components, a crossed-grating is employed, i.e., grating lines running in both the X and Y directions.

All wavelengths below the period of the grating would pass thru the grating spaces. Any EUV radiation that hits the grating lines will get absorbed, while that which passes through the spaces is transmitted. If the grating lines represent only 5% of the grating area, then 5% of the EUV radiation will be absorbed, 95% will be transmitted, and substantially no infrared radiation at wavelengths longer than the grating period will be transmitted.

To produce a master pattern of grating lines with the appropriate period and the appropriate linewidths, a suitable substrate is selected. An example substrate is a silicon wafer or thin glass. The wafer is coated with a thin chrome layer (e.g., less than 0.1 micron thick) as an adhering layer. The thin chrome layer is then coated with a thin (e.g., about 0.1 micron) plate-able metal layer, such as gold or other suitable metal. The metal layer is then coated with photoresist of a desired thickness. A master grid pattern with the appropriate period is lithographically formed in the photoresist layer.

Developing the photoresist provides the negative of the grating pattern in the photoresist atop the plate-able metal layer. The photoresist layer is then plated with the same plate-able metal as the underlying plate-able metal layer. The photoresist is then washed away, e.g., using acetone. The resulting structure is now a thick metal grating atop of the approximately 0.2 micron thick chrome and plate-able metal layers supported by the substrate.

A support structure can be attached to the outside of the metal grating structure so that the metal structure can be free-standing inside of the support structure. An example support structure is a washer that is epoxied to the metal grating structure. The grating structure periphery can be made to be thick and free of grating lines. At this point, chrome and plate-able metal layers are removed, e.g., using a liquid or beam etch process. Next, the substrate is removed, e.g., by a liquid etch suitable for the particular substrate (e.g., HF for a glass substrate).

The result is a free-standing, metal crossed grating supported around its outer edge so that it can be handled and also mounted into position relative to the RCED 100.

EUV Lithography System with EUV Collector and RCED

Figure 23:
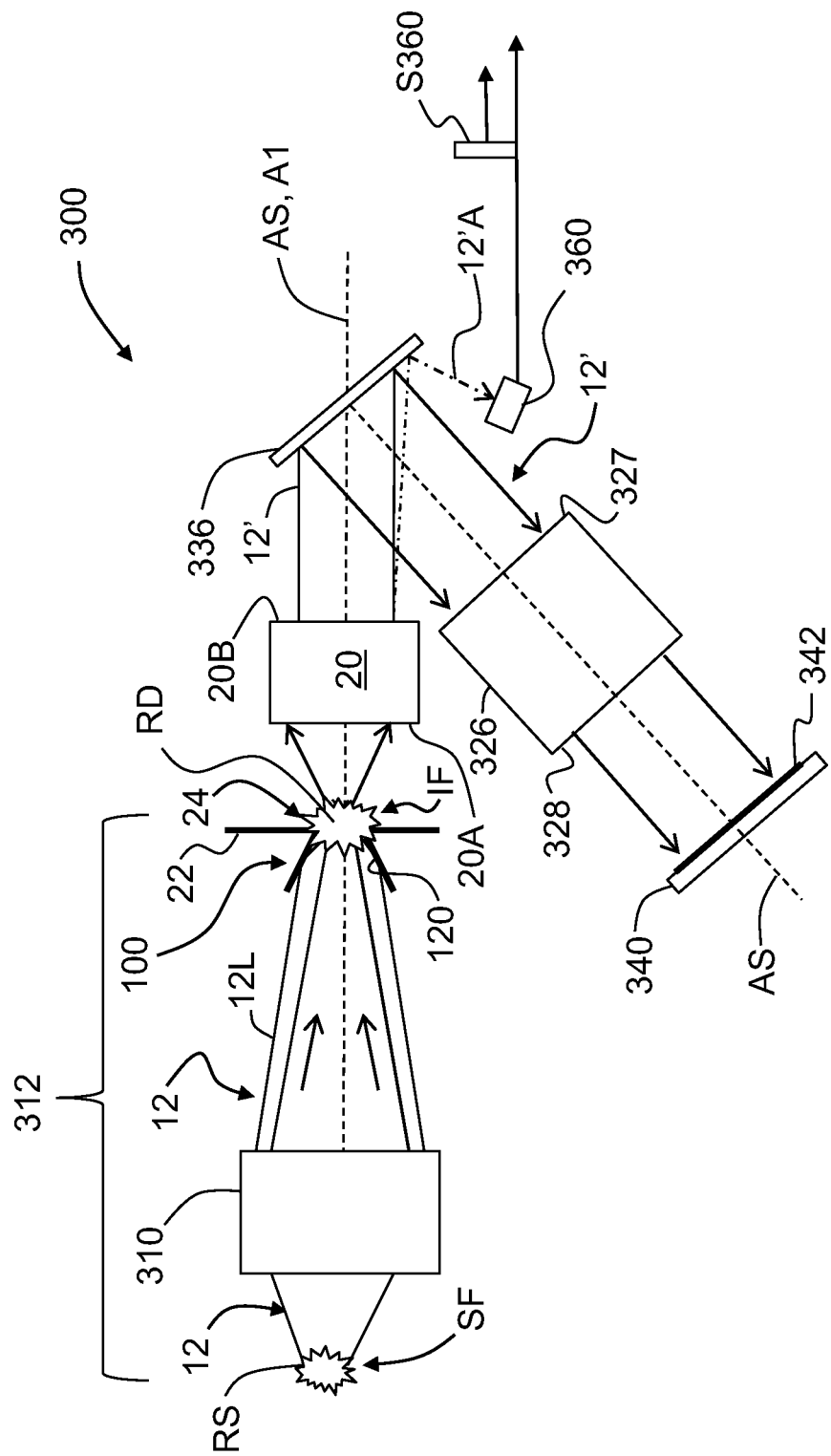
FIG. 23 is a schematic diagram of an EUV lithography system that uses an EUV collector system that employs the RCED of the present disclosure.

FIG. 23 is an example EUV lithography system ("lithography system") 300 according to the present disclosure. Example lithography systems are disclosed, for example, in U.S. Patent Applications No. U.S. 2004/0265712A1, U.S. 2005/0016679A1 and U.S. 2005/0155624A1, which are incorporated herein by reference.

Lithography system 300 includes a system axis AS and an EUV radiation source RS that emits working EUV radiation 12 nominally at λ=13.5 nm. Lithography system 300 also includes along system axis AS an EUV collector mirror (NIC or GIC) 310 and a RCED 100 as described above. EUV collector mirror 310 and RCED 100 comprise a collector system 312. Collector system 312 also optionally includes EUV radiation source RS. EUV radiation source RS may include, for example, a LPP EUV radiation source or a DPP EUV radiation source.

An illuminator 20 with an input end 20A and an output end 20B is arranged along system axis AS and adjacent and downstream of collector system 312. Illuminator 20 includes entrance aperture member 22 with entrance aperture 24.

EUV collector mirror 310 (shown configured as a GIC mirror for illustration) collects EUV radiation 12 from EUV radiation source RS located at source focus SF. The collected EUV radiation 12 is directed to entrance aperture 24, with the intention of forming a radiation distribution RD at intermediate focus IF. RCED 100 operates as described above to enhance the EUV radiation 12 focusing process by redirecting at least a portion of EUV radiation 12L that would otherwise not pass through entrance aperture 24 to the illuminator 20, to pass through entrance aperture 24. Thus, illuminator 20 receives at input end 20A EUV radiation 12 at the intermediate focus plane PL from radiation distribution RD and outputs at output end 20B a more uniform EUV radiation 12' (i.e., condensed EUV radiation) to a reflective reticle 336. Where lithography system 300 is a scanning type system, EUV radiation 12' is typically formed as a substantially uniform line of EUV radiation at reflective reticle 336 that scans over the reflective reticle 336.

It is also noted that illuminator 20 may image a portion of the EUV radiation passing through entrance aperture 24 to a region outside of the reticle patterned area (e.g., in a kerf), and that this EUV radiation (denoted 12'A in FIG. 23) can be used for alignment purposes, e.g., by being incident upon reticle alignment marks that reside outside of the patterned area used for forming microcircuit features. In an example embodiment, EUV radiation 12'A is detected by a photodetector 360, which forms electronic signals S360 that can be processed (e.g., in a computer, not shown) to perform alignment.

A projection optical system 326 is arranged along (folded) system axis AS downstream of illuminator 20 and reflective reticle 336. Projection optical system 326 has an input end 327 facing output end 20B of illuminator 20, and an opposite output end 328. Reflective reticle 336 is arranged adjacent the input end 327 of projection optical system 326 and a semiconductor wafer 340 is arranged adjacent output end 328 of projection optical system 326. Reflective reticle 336 includes a pattern (not shown) to be transferred to semiconductor wafer 340, which includes a photosensitive coating (e.g., photoresist layer) 342. In operation, the uniformized EUV radiation 12' irradiates reflective reticle 336 and reflects therefrom, and the reticle pattern is imaged onto surface of photosensitive coating 342 of semiconductor wafer 340 by projection optical system 326. In a lithography system 300, the reticle image scans over the surface of photosensitive coating 342 to form the pattern over the exposure field. Scanning is typically achieved by moving reflective reticle 336 and semiconductor wafer 340 in synchrony.

Once the reticle pattern is imaged and recorded on semiconductor wafer 340, the patterned semiconductor wafer 340 is then processed using standard photolithographic and semiconductor processing techniques to form integrated circuit (IC) chips.

Note that the components of lithography system 300 are shown lying along a common folded system axis AS in FIG. 23 for the sake of illustration. One skilled in the art will understand that there can be more than one fold in lithography system 300, and that there can be an offset between entrance and exit axes for the various components such as for illuminator 20 and for projection optical system 326.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A method of collecting extreme ultraviolet (EUV) radiation from an EUV radiation source and directing the EUV radiation through an aperture of an aperture member, comprising:
   collecting with an EUV collector mirror the EUV radiation from the radiation source and directing the EUV radiation to the aperture; and
   collecting in a non-imaging manner portion of the directed EUV radiation that reflects from the collector mirror and that would not otherwise pass through the aperture with at least one first grazing-incidence redirecting surface arranged immediately adjacent the aperture member to redirect said portion of EUV radiation through the aperture.

2. The method of claim 1, further comprising configuring the at least one first grazing-incidence redirecting surface to improve an angular distribution of EUV radiation at a far-field location as compared to an angular distribution at the far-field location without the at least one grazing-incidence redirecting surface.

3. The method of claim 1, wherein the EUV collector mirror has at least one of a grazing-incidence mirror and a normal-incidence mirror.

4. The method of claim 1, wherein the EUV collector mirror has an associated angular distribution of EUV radiation directed toward the aperture, and wherein the at least one grazing incidence redirecting surface acts to change said angular distribution.

5. The method of claim 1, further comprising:
   forming from the EUV radiation that passes through the aperture condensed EUV radiation for illuminating a reflective reticle.

6. The method of claim 5, further comprising receiving reflected EUV radiation from the reflective reticle and forming a reticle image on a photosensitive semiconductor wafer using a projection optical system.

7. The method of claim 1, wherein the at least one first grazing-incidence redirecting surface includes at least one of a linear tapered surface, a curved taper surface and faceted tapered surface.

8. The method of claim 1, wherein the at least one first grazing-incidence redirecting surface includes at least one of: a polished surface, a rough surface, a planar surface, a curved surface, an undulating surface and a reflective coating.

9. The method of claim 1, wherein the at least one first grazing-incidence redirecting surface includes a plurality of reflective surfaces.

10. The method of claim 1, wherein the aperture member has opposite first and second sides, wherein the at least one first grazing-incidence redirecting surface is immediately adjacent the first side, and further comprising:
    at least one second grazing-incidence redirecting surface arranged immediately adjacent the second side of the aperture member.

11. The method of claim 1, wherein the at least one first grazing-incidence redirecting surface has a first axial length, the at least one second grazing-incidence redirecting surface has a second axial length that is different from the first axial length.

12. The method of claim 1, wherein the at least one first grazing-incidence redirecting surface has a first curvature, the at least one second grazing-incidence redirecting surface has a second curvature that is different from the first curvature.

13. In an extreme ultraviolet (EUV) lithography system having an aperture member with an aperture, a method of collecting EUV radiation, comprising:
generating the EUV radiation with an EUV radiation source;
collecting the EUV radiation from the EUV radiation source with an EUV collector and directing the EUV radiation toward the aperture member, wherein a first portion of the directed EUV radiation is directed to pass through the aperture and a second portion of EUV radiation reflects from the EUV collector and is directed to be intercepted by the aperture member; and
collecting in a non-imaging manner the second portion of EUV radiation with at least one first grazing-incidence redirecting surface arranged adjacent the aperture member, and redirecting said portion of EUV radiation through the aperture so that both the first and second portions of the directed EUV radiation pass through the aperture.

14. The method of claim 13, further comprising:
condensing the first and second portions of EUV radiation passing through the aperture; and
illuminating a reflective reticle with the condensed EUV radiation.

15. The method of claim 14, further comprising:
imaging EUV radiation reflected from the reflective reticle onto a photosensitive wafer.

16. The method of claim 13, further comprising redirecting with at least one second redirecting surface at least a portion of the EUV radiation that passes through the aperture.

17. The method of claim 13, wherein the at least one first grazing-incidence redirecting surface is spaced apart from the aperture.

18. A method of collecting extreme ultraviolet (EUV) radiation from an EUV radiation source and directing the EUV radiation through an aperture of an aperture member that has a first side closest to the EUV radiation source and a second opposite side, comprising:
collecting with an EUV collector mirror the EUV radiation from the radiation source and directing the EUV radiation to the aperture member; and
collecting in a non-imaging manner a portion of the directed EUV radiation that reflects from the collector mirror and that would not otherwise pass through the aperture with a first grazing-incidence redirecting device arranged immediately adjacent the first side of the aperture to redirect said portion of EUV radiation through the aperture; and
using a second grazing-incidence redirecting device arranged immediately adjacent the second side of the aperture to grazingly redirect at least some of the portion of the EUV radiation that passes through the aperture.

19. The method of claim 18, wherein the first and second grazing-incidence redirecting devices are respectively attached to the first and second sides of the aperture member.

20. The method of claim 18, wherein the first and second grazing-incidence redirecting devices each have at least one grazing-incidence surface with a taper that widens with distance from the aperture member.

21. The method of claim 20, wherein the taper is linear.

22. The method of claim 18, wherein the first and second grazing-incidence redirecting devices have respective first and second grazing-incidence reflecting surfaces.

23. The method of claim 18, wherein the first grazing-incidence redirecting device has a first axial length, and the second grazing-incidence redirecting device has a second axial length that is different from the first axial length.

24. The method of claim 18, wherein the first grazing-incidence redirecting device has a first curvature, and the second grazing-incidence redirecting device has a second curvature that is different from the first curvature.

25. The method of claim 18, wherein the EUV collector mirror has an associated angular distribution of EUV radiation directed toward the aperture, and wherein the first and second grazing incidence redirecting devices act to change said angular distribution.

26. The method of claim 25, wherein the EUV collector mirror has an associated spatial distribution of EUV radiation directed toward the aperture, and wherein the first and second grazing incidence redirecting devices act to change said spatial distribution.

* * * * *